US009540487B2

(12) United States Patent
Fukukawa et al.

(10) Patent No.: US 9,540,487 B2
(45) Date of Patent: Jan. 10, 2017

(54) POLYIMIDE COMPOSITE MATERIAL AND FILM THEREOF

(75) Inventors: Kenichi Fukukawa, Chiba (JP); Yoshihiro Sakata, Ichikawa (JP); Ichiro Fujio, Ichihara (JP); Wataru Yamashita, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 753 days.

(21) Appl. No.: 12/744,934

(22) PCT Filed: Nov. 27, 2008

(86) PCT No.: PCT/JP2008/071524
§ 371 (c)(1),
(2), (4) Date: May 27, 2010

(87) PCT Pub. No.: WO2009/069688
PCT Pub. Date: Jun. 4, 2009

(65) Prior Publication Data
US 2010/0304160 A1    Dec. 2, 2010

(30) Foreign Application Priority Data

Nov. 30, 2007 (JP) ................................. 2007-311130
Jun. 20, 2008 (JP) ................................. 2008-161916
Jun. 20, 2008 (JP) ................................. 2008-161917
Jun. 20, 2008 (JP) ................................. 2008-161918
Jun. 20, 2008 (JP) ................................. 2008-161919
Jun. 20, 2008 (JP) ................................. 2008-161920

(51) Int. Cl.
C08G 73/10      (2006.01)
C08K 3/22       (2006.01)
C08K 3/24       (2006.01)
C09D 179/08     (2006.01)
C08K 3/34       (2006.01)
C08L 79/08      (2006.01)
H05K 1/03       (2006.01)

(52) U.S. Cl.
CPC ....... *C08G 73/1075* (2013.01); *C08G 73/1007* (2013.01); *C08G 73/1039* (2013.01); *C08G 73/1082* (2013.01); *C09D 179/08* (2013.01); C08K 3/22 (2013.01); C08K 3/34 (2013.01); C08K 2003/2206 (2013.01); C08K 2003/2224 (2013.01); C08L 79/08 (2013.01); H05K 1/0346 (2013.01); H05K 1/0373 (2013.01); H05K 2201/0108 (2013.01); Y10T 428/31681 (2015.04); Y10T 428/31721 (2015.04)

(58) Field of Classification Search
CPC ... C08L 79/08; C08K 3/22; C08K 2003/2206; C08K 2003/2224; C08K 3/34; C08G 73/1007; C08G 73/1075; C08G 73/1039; C08G 73/1082; C09D 179/08; H05K 1/0346; H05K 1/0373; H05K 2201/0108; Y10T 428/31681; Y10T 428/31721
See application file for complete search history.

(56) References Cited

U.S. PATENT DOCUMENTS

| 3,767,550 A * | 10/1973 | Boldebuck ................ 204/495 |
| 4,403,061 A * | 9/1983 | Brooks et al. ............. 524/433 |
| 4,528,303 A * | 7/1985 | Segaud ..................... 523/212 |
| 4,965,337 A | 10/1990 | Peters et al. |
| 5,952,448 A * | 9/1999 | Lee et al. .................. 528/170 |
| 6,133,408 A * | 10/2000 | Chiu et al. ................. 528/353 |
| 6,214,923 B1 * | 4/2001 | Goto et al. ................. 524/514 |
| 2002/0188090 A1 | 12/2002 | Yamashita et al. |
| 2003/0090345 A1 | 5/2003 | Cooray et al. |
| 2004/0018131 A1 | 1/2004 | Izumida et al. |
| 2004/0266979 A1 | 12/2004 | Oguro et al. |
| 2005/0070659 A1 * | 3/2005 | Shiow-Ling ......... C08L 27/12 524/502 |
| 2005/0100738 A1 * | 5/2005 | Hirota et al. ............. 428/411.1 |
| 2005/0184635 A1 * | 8/2005 | Taomoto et al. .......... 313/311 |

FOREIGN PATENT DOCUMENTS

| JP | 37-016844 B1 | 10/1962 |
| JP | 43-013387 B1 | 6/1968 |
| JP | 62-068817 A | 3/1987 |
| JP | 03-047837 A | 2/1991 |
| JP | 03-68629 A | 3/1991 |

(Continued)

OTHER PUBLICATIONS

K. Fukukawa, I. Fujio, W. Yamashita, S Tamai. "Effect of Thermally Treated Talc in Poly(amic acid) and Characterization of the Polyimide Composite Film" Journal of Photopolymer Science and Technology. vol. 21(1) (2008) p. 101-106.*
Machine translation of JP 06049360 (1994).*
International Search Report for PCT/JP2008/071524, mailed Dec. 22, 2008.
Extended European Search Report issued in corresponding European Application No. 08 85 5621 dated Nov. 20, 2012.
Office Action issued in corresponding Taiwanese Patent Application No. 97146321 dated Jul. 18, 2013.
Office Action issued in corresponding Japanese Patent Application No. 2009-543842 dated Aug. 13, 2013.

Primary Examiner — Callie Shosho
Assistant Examiner — John Freeman
(74) Attorney, Agent, or Firm — Buchanan, Ingersoll & Rooney PC

(57) ABSTRACT

A polyamic acid solution includes a polyamic acid, a solvent (C) in which the polyamic acid (PAA1) is dissolved, and a substance (M) that can release at least one metal selected from groups 1 and 2 of the periodic table as a metal ion, or a substance (m) that contains the substance (M). A polyimide composite is produced from the polyamic acid solution. The polyimide composite can provide a greatly improved glass transition temperature without impairing the intrinsic physical properties of the polyimide.

33 Claims, 1 Drawing Sheet

(56) References Cited

FOREIGN PATENT DOCUMENTS

| | | | |
|---|---|---|---|
| JP | 05-178991 | A | 7/1993 |
| JP | 05-255501 | A | 10/1993 |
| JP | 05-320339 | A | 12/1993 |
| JP | 06-049360 | A | 2/1994 |
| JP | 06-049361 | A | 2/1994 |
| JP | 06049360 | A  * | 2/1994 |
| JP | 06-207015 | A | 7/1994 |
| JP | 2002-030216 | A | 1/2002 |
| JP | 2003-105084 | A | 4/2003 |
| JP | 2003-192891 | A | 7/2003 |
| JP | 2003-212995 | A | 7/2003 |
| JP | 2003-212996 | A | 7/2003 |
| JP | 2005-015629 | A | 1/2005 |
| JP | 2006-282682 | A | 10/2006 |
| JP | 2006-291003 | A | 10/2006 |
| JP | 2007-197715 | A | 8/2007 |
| JP | 2007-284468 | A | 11/2007 |
| JP | 2008-179751 | A | 8/2008 |
| TW | 538071 | B | 6/2003 |
| WO | WO 02/10253 | A1 | 2/2002 |

* cited by examiner

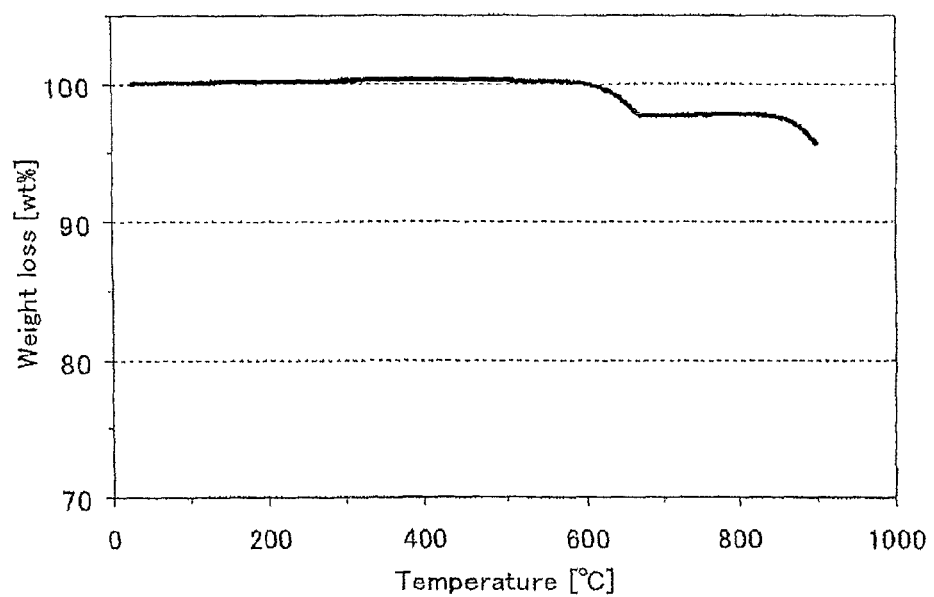

POLYIMIDE COMPOSITE MATERIAL AND FILM THEREOF

TECHNICAL FIELD

The present invention relates to a polyimide composite material and a polyimide composite film manufactured from the polyimide composite material.

BACKGROUND ART

Because of excellent mechanical and electrical characteristics, as well as high heat resistance, polyimides have been widely used in various fields as molding materials, composite materials, and electrical and electronic materials.

In the field of electrical and electronic materials, lead-free solder is becoming mainstream from an environmental point of view. Since lead-free solder has a higher reflow temperature than before, there is a demand for polyimides having higher heat resistance than before.

One known technique for increasing the glass transition temperature (Tg) of polyimide is a copolymerization method. For example, according to Japanese Unexamined Patent Application Publication No. 2003-212995 (Patent Document 1) and No. 2003-212996 (Patent Document 2), a diamine compound or tetracarboxylic acid dianhydride having a particular structure is copolymerized with a conventional diamine compound and/or tetracarboxylic acid to improve the physical properties, such as heat resistance and mechanical characteristics, of polyimide while maintaining the intrinsic properties of the polyimide. However, new monomers are sometimes not versatile materials because of the use of expensive raw materials or the difficulty with which the new monomers are synthesized.

Another known technique for increasing the Tg of polyimide is a method for introducing a functional group for thermal crosslinking into an end of polyimide, as disclosed in Japanese Unexamined Patent Application Publication No. 2006-291003 (Patent Document 3). However, this method involves altering the molar ratio between a diamine compound monomer, a tetracarboxylic acid dianhydride monomer, and an end group compound in a predetermined range. This inevitably results in a decrease in the molecular weight of polyimide, possibly affecting the physical properties of the polyimide.

For example, a polyimide having the following formula (A) is known as a representative polyimide.

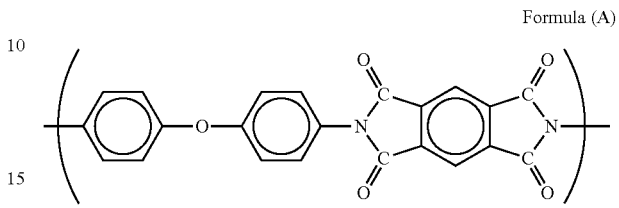

Formula (A)

An aromatic polyimide having the formula (A) is widely used particularly in an electronic material field. Films manufactured from this polyimide have high heat resistance and excellent mechanical characteristics.

Likewise, an aromatic polyimide having the following formula (B) is mostly used in the form of a film and is mainly used in the electronic material field.

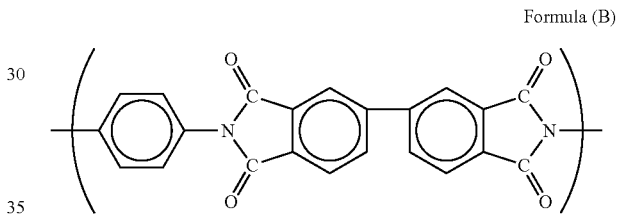

Formula (B)

In spite of its high heat resistance, the aromatic polyimide having the formula (A) or (B) is called non-thermoplastic polyimide and cannot be used in thermoplastic applications, for example, hot-melt adhesives and injection molding materials.

Thus, various thermoplastic polyimides have been developed. For example, a polyimide having the following formula (C) has a glass transition temperature of approximately 215° C.

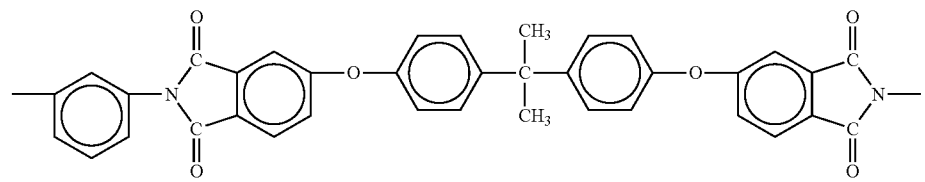

Polyimides having still higher glass transition temperatures, such as polyimides having the following formulas (D) and (E), have been developed (for example, Patent Documents 4 to 7: U.S. Pat. No. 4,965,337 and Japanese Unexamined Patent Application Publication No. 03-068629, No. 05-320339, and No. 62-068817).

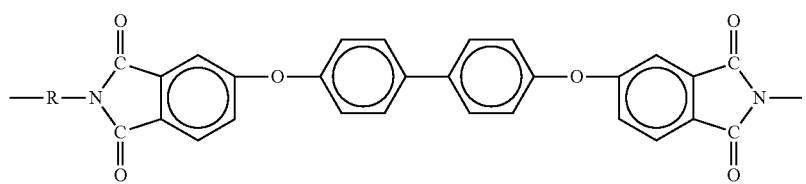

Formula (D)

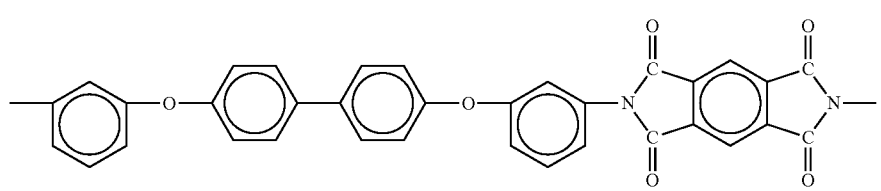

Formula (E)

In particular, the polyimide having the formula (E) has a glass transition temperature of approximately 250° C. and has very high heat resistance. In order to further increase the glass transition temperature of this polyimide, for example, a copolyimide manufactured by the copolymerization with an aromatic diamine compound having the following formula (F) has been developed (for example, Patent Document 8: Japanese Unexamined Patent Application Publication No. 03-047837).

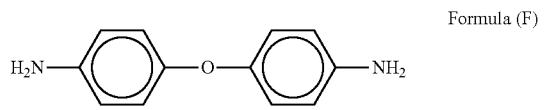

Formula (F)

In this copolyimide, 10% by mole of a diamine component of the polyimide having the formula (E) can be substituted by the diamine having the formula (F) to increase the glass transition temperature by approximately 10° C. Although the aromatic diamine component having the formula (F) may be increased to further raise the glass transition temperature, such copolymerization impairs the intrinsic resin properties of the formula (E), producing a completely different resin.

Thus, a technique for increasing the glass transition temperature of polyimide while maintaining the intrinsic properties of the polyimide, that is, the intrinsic properties resulting from its molecular structure has not been found.

The polyimide having the formula (A) is widely used particularly in an electronic material field. Although films manufactured from this polyimide have high heat resistance and excellent mechanical characteristics, the films are yellowish brown and cannot be used as optical materials.

Likewise, the polyimide having the following formula (B) is mostly used in the form of a film and is mainly used in an electronic material field. Although this polyimide has high heat resistance and excellent mechanical characteristics, its films are reddish brown and cannot be used as optical materials.

Many studies have been conducted to solve the substantial coloring of such polyimides. For example, a technique for introducing a fluorine-containing group, such as a fluoro group or a trifluoromethyl group, into the main chain skeleton of polyimide has been developed. For example, the present inventors have disclosed various polyimides in Japanese Unexamined Patent Application Publication No. 05-178991 (Patent Document 9), No. 05-255501 (Patent Document 10), and No. 06-207015 (Patent Document 11). However, these polyimides require very expensive raw materials to introduce essential substituents. This constitutes a barrier to practical use.

At the same time, improvements of optical properties, such as colorless transparency, and other physical properties of polyimide have also been tried without introducing an expensive fluorine-containing group. For example, an alicyclic acid dianhydride or a diamine compound is used to develop a polyimide having improved optical properties, such as colorless transparency. As an example of using an alicyclic compound monomer as an acid dianhydride, Japanese Unexamined Patent Application Publication No. 2005-15629 (Patent Document 12) discloses a polyimide having a structure expressed by the following formula (G) derived from 1,2,4,5-cyclohexanetetracarboxylic acid dianhydride.

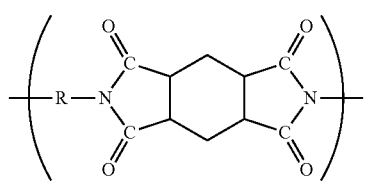

Formula (G)

As an example of using an alicyclic diamine compound as a diamine compound, WO 02/10253 (Patent Document 13) discloses a polyimide having a structure expressed by the following formula (H) derived from diaminomethyl-bicyclo[2.2.1]heptane.

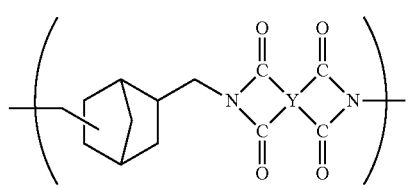

Formula (H)

The polyimides having the formulae (G) and (H) have excellent colorless transparency, as well as their intrinsic high heat resistance. These polyimides are finding various applications, for example, display material members, including LCD, and flexible circuit materials. Flexible circuit materials have already been commercialized using conventional polyimides.

These applications generally require a processing temperature above 200° C. However, the polyimides having the formulae (G) and (H) have coefficients of linear expansion of approximately 50 ppm/K at approximately 200° C. and possibly cause problems during processing. For example, because of such a high coefficient of linear expansion, in a multilayer flexible substrate composed of such a polyimide and copper foil having a coefficient of linear expansion of 17 ppm/K, the circuit may have low precision or warping resulting from a difference in the coefficient of linear expansion.

In view of the situations described above, also for polyimides having excellent colorless transparency, there is a demand for a modifying method by which the coefficient of linear expansion of polyimide can be control to adapt the polyimide to various processing conditions without impairing a remarkable physical property of colorless transparency.

[Patent Document 1] Japanese Unexamined Patent Application Publication No. 2003-212995
[Patent Document 2] Japanese Unexamined Patent Application Publication No. 2003-212996
[Patent Document 3] Japanese Unexamined Patent Application Publication No. 2006-291003
[Patent Document 4] U.S. Pat. No. 4,965,337
[Patent Document 5] Japanese Unexamined Patent Application Publication No. 03-068629
[Patent Document 6] Japanese Unexamined Patent Application Publication No. 05-320339
[Patent Document 7] Japanese Unexamined Patent Application Publication No. 62-068817
[Patent Document 8] Japanese Unexamined Patent Application Publication No. 03-047837
[Patent Document 9] Japanese Unexamined Patent Application Publication No. 05-178991
[Patent Document 10] Japanese Unexamined Patent Application Publication No. 05-255501
[Patent Document 11] Japanese Unexamined Patent Application Publication No. 06-207015
[Patent Document 12] Japanese Unexamined Patent Application Publication No. 2005-15629 [Patent Document 13] WO 02/10253

DISCLOSURE OF INVENTION

Problems to be Solved by the Invention

The present invention provides a polyimide composite having improved heat resistance and linear expansion coefficient without impairing the intrinsic properties of the molecular structure of the polyimide, and a film thereof.

It is another object of the present invention to provide a technique for improving the heat resistance, for example, the glass transition temperature of polyimide without changing the basic resin structure of the polyimide or impairing the intrinsic optical properties of the polyimide resin itself.

It is still another object of the present invention to provide a polyimide composite having an improved linear expansion coefficient and heat resistance without impairing the intrinsic colorless transparency of a colorless and transparent polyimide, and a film thereof.

Means for Solving the Problems

As a result of diligent investigations to achieve the objects described above, the present inventors arrived at the present invention by finding that a combination of a polyimide and a particular substance can achieve the objects. The present invention includes the following items.

[1] A polyamic acid solution (S2) comprising:
a polyamic acid (PAA1) having the following general formula (1);

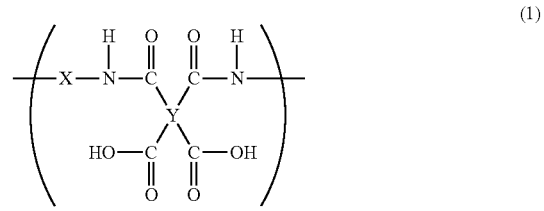

(in the formula (1), X denotes a divalent organic group, and Y denotes a tetravalent organic group)
a solvent (C) in which the polyamic acid (PAA1) is dissolved; and
a substance (M) that can release at least one metal selected from groups 1 and 2 of the periodic table as a metal ion, or a substance (m) that contains the substance (M).

[2] The polyamic acid solution (S2) according to [1], wherein the substance (m) is heat-treated talc (T).

[3] The polyamic acid solution (S2) according to [2], wherein the talc (T) is talc that is heat-treated at a temperature in the range of 650° C. to 800° C.

[4] The polyamic acid solution (S2) according to any of [1] to [3], wherein the solvent (C) is an aprotic polar solvent (C).

[5] A method for producing the polyamic acid solution (S2) according to [1] comprising the following steps 1 and 2 of:
(step 1) producing a polyamic acid solution (S1) produced from a polyamic acid (PAA1) having a general formula (1) (wherein X denotes a divalent organic group, and Y denotes a tetravalent organic group) and a solvent (C) in which the polyamic acid (PAA1) is dissolved, the polyamic acid (PAA1) being produced from a tetracarboxylic acid anhydride (A) and a diamine compound (B); and

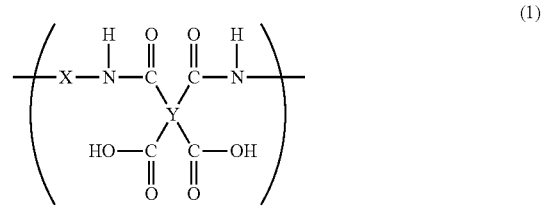

in the formula (1), X denotes a divalent organic group, and Y denotes a tetravalent organic group)
(step 2) adding 1 to 30 equivalents of a substance (M) that can release at least one metal selected from groups 1 and 2 of the periodic table as a metal ion per 100 equivalents of a constitutional repeating unit of the polyamic acid (PAA1) having the formula (1) to the polyamic acid solution (S1) produced in the step 1 to produce a polyamic acid solution (S2), wherein the solution viscosity (V1) of the polyamic acid solution (S1) before the addition of the substance (M) (E-type viscosity measured at 25° C.) and the solution viscosity (V2) of the polyamic acid solution (S2) after the addition of the substance (M) (E-type viscosity measured at 25° C.) satisfy the following formula (I).

$$(V2/V1) \times 100 \geq 120\% \qquad (I)$$

[6] A polyimide composite (PIC) produced from the polyamic acid solution (S2) according to any of [1] to [4].

[7] The polyimide composite (PIC) according to [6] produced by a production method comprising the following steps 1 to 3 of:

(step 1) producing a polyamic acid solution (S1) produced from a polyamic acid (PAA1) having a general formula (1) (wherein X denotes a divalent organic group, and Y denotes a tetravalent organic group) and a solvent (C) in which the polyamic acid (PAA1) is dissolved, the polyamic acid (PAA1) being produced from a tetracarboxylic acid anhydride (A) and a diamine compound (B);

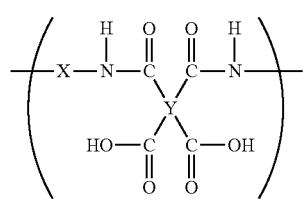
(1)

(in the formula (1), X denotes a divalent organic group, and Y denotes a tetravalent organic group)

(step 2) adding 1 to 30 equivalents of a substance (M) that can release at least one metal selected from groups 1 and 2 of the periodic table as a metal ion per 100 equivalents of a constitutional repeating unit of the polyamic acid (PAA1) having the formula (1) to the polyamic acid solution (S1) produced in the step 1 to produce a polyamic acid solution (S2), wherein the solution viscosity (V1) of the polyamic acid solution (S1) before the addition of the substance (M) (E-type viscosity measured at 25° C.) and the solution viscosity (V2) of the polyamic acid solution (S2) after the addition of the substance (M) (E-type viscosity measured at 25° C.) satisfy the following formula (I); and $$(V2/V1) \times 100 \geq 120\% \qquad (I)$$

(step 3) producing the polyimide composite (PIC) by imidization of a polyamic acid (PAA2) contained in the polyamic acid solution (S2) produced in the step 2 and removal of the solvent (C).

[8] The polyimide composite (PIC) according to [7], wherein the glass transition temperature (Tg1) of a polyimide (PI) produced not through the step 2 but through the step 3 using the polyamic acid solution (S1) produced in the step 1 according to [7] and the glass transition temperature (Tg2) of the polyimide composite (PIC) produced according to [7] satisfy the following formula (II) (K means absolute temperature).

$$Tg2 - Tg1 \geq 5\ K \qquad (II)$$

[9] The polyimide composite according [6], wherein a polyimide contained in the polyimide composite (PIC) according to [6] includes a constitutional unit having the following general formula (2).

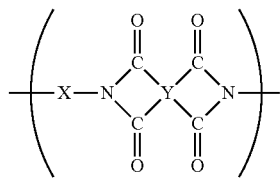
(2)

(in the formula (2), X denotes a divalent organic group, and Y denotes a tetravalent organic group)

[10] The polyimide composite (PIC) according to [9], wherein X in the constitutional unit having the general formula (2) is at least one divalent alicyclic group selected from the group consisting of

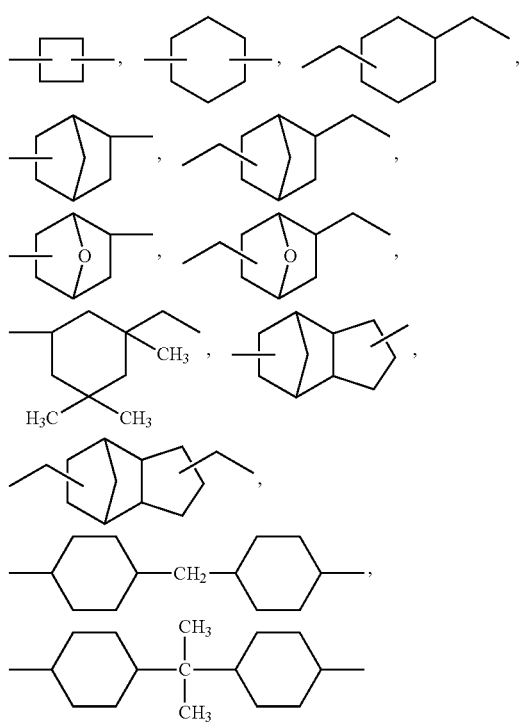

or at least one bivalent aromatic group selected from the group consisting of

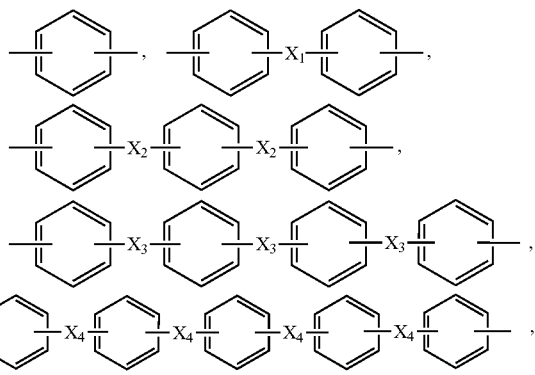

-continued

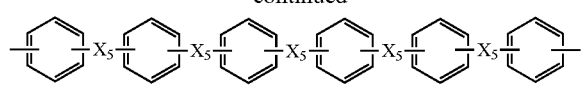

(wherein $X_1$ to $X_5$ are selected from

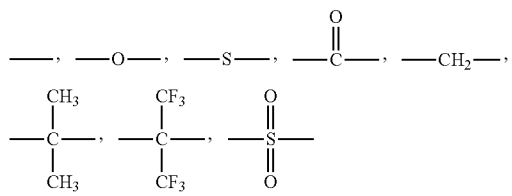

and $X_2$ to $X_5$ may be the same or different from one another)

Y in the constitutional unit having the general formula (2) is at least one tetravalent aromatic group selected from the group consisting of

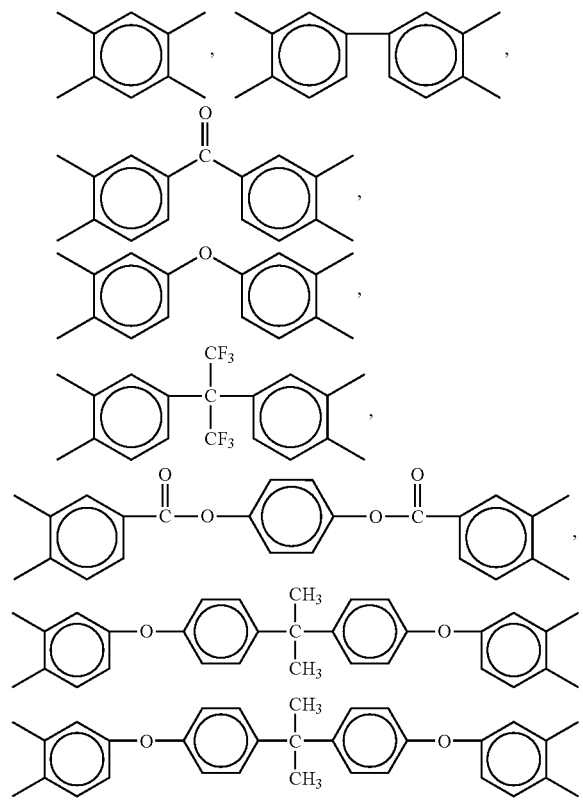

or at least one tetravalent alicyclic group selected from the group consisting of

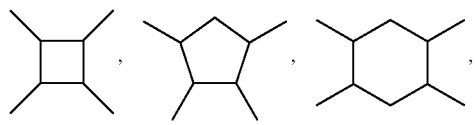

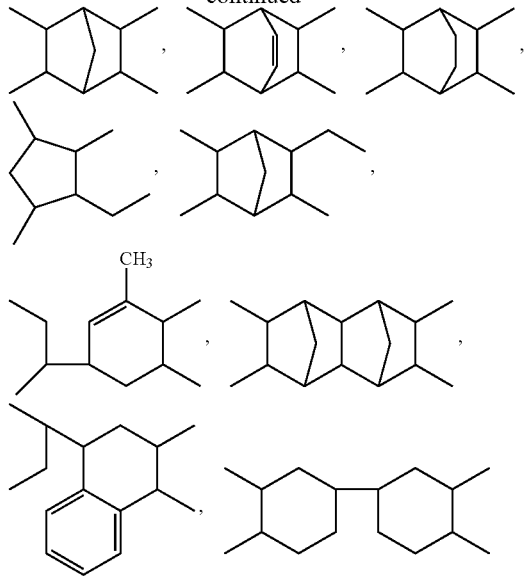

[11] The polyimide composite (PIC) according to [9] or [10], wherein X in the constitutional unit having the general formula (2) is a divalent alicyclic group containing 4 to 15 carbon atoms, and Y is a tetravalent aromatic group containing 6 to 27 carbon atoms.

[12] The polyimide composite (PIC) according to [9] or [10], wherein X in the constitutional unit having the general formula (2) is a divalent aromatic group containing 6 to 51 carbon atoms, and Y is a tetravalent alicyclic group containing 4 to 12 carbon atoms.

[13] The polyimide composite (PIC) according to [9] or [10], wherein X in the constitutional unit having the general formula (2) is a divalent alicyclic group containing 4 to 15 carbon atoms, and Y is a tetravalent alicyclic group containing 4 to 12 carbon atoms.

[14] The polyimide composite (PIC) according to [9] or [10], wherein X in the constitutional unit having the general formula (2) is a divalent aromatic group containing 6 to 51 carbon atoms, and Y is a tetravalent aromatic group containing 6 to 27 carbon atoms.

[15] The polyimide composite (PIC) according to any of [9] to [14], comprising 5 to 50 parts by weight of heat-treated talc (T) as a substance (m) per 100 parts by weight of the polyimide, the substance (m) containing a substance (M) that can release at least one metal selected from groups 1 and 2 of the periodic table as a metal ion.

[16] The polyimide composite (PIC) according to [6], wherein the polyimide composite (PIC) has a glass transition temperature of 200° C. or more.

[17] The polyimide composite (PIC) according to [15], wherein the polyimide composite (PIC) has a glass transition temperature of 200° C. or more and a coefficient of linear expansion below 50 ppm/K at a temperature in the range of 100° C. to 200° C.

[18] The polyimide composite (PIC) according to [15], wherein the polyimide composite (PIC) has a glass transition temperature of 200° C. or more, a total light transmittance of 80% or more, and a coefficient of linear expansion below 50 ppm/K at a temperature in the range of 100° C. to 200° C.

[19] A polyamic acid composite (PAAC) produced by removing a solvent contained in the polyamic acid solution (S2) according to any of [1] to [4].

[20] A polyimide composite film manufactured from the polyamide composite (PIC) according to any of [6] to [18].

[21] The polyimide composite film according to [20], wherein the polyimide composite film is a colorless and transparent optical film.

[22] A polyimide/metal composite laminate comprising at least one layer formed from the polyimide composite (PIC) according to any of [6] to [18].

[23] A cover material for a photosensitive resin, produced from the polyimide composite (PIC) according to any of [6] to [18].

[24] A coating material, comprising the polyamic acid solution (S2) according to any of [1] to [4] or the polyamic acid composite (PAAC) according to [19].

[25] A method for manufacturing a polyimide composite film, involving: applying the polyamic acid solution (S2) according to any of [1] to [4] at a thickness in the range of 10 to 1000 μm; and heating the polyamic acid solution (S2) at a temperature in the range of 150° C. to 300° C. for 30 minutes to 4 hours in the air or in an inert atmosphere.

Advantages

A polyimide composite comprising a polyimide and a particular substance (M) according to the present invention has a greatly improved glass transition temperature without impairing the intrinsic physical properties of the polyimide. The polyimide composite is suitable for coating materials, display materials, such as displays, or circuit board materials.

Furthermore, in a composite comprising an aromatic polyimide and a particular substance (m) according to the present invention, the polyimide has a greatly improved glass transition temperature and a reduced coefficient of linear expansion without impairing the intrinsic physical properties of the molecular structure of the polyimide. In a polyimide composite comprising a colorless and transparent polyimide and a particular substance (m) according to the present invention, the polyimide has an improved coefficient of linear expansion and a greatly improved glass transition temperature without impairing the intrinsic heat resistance and colorless transparency of the polyimide. These polyimide composites are suitable for display materials, such as displays, or circuit board materials.

BRIEF DESCRIPTION OF DRAWINGS

FIG. 1 is a graph showing the thermal weight loss of talc in the air in Synthesis Example 1B.

BEST MODES FOR CARRYING OUT THE INVENTION

Polyamic Acid Composite (1) and Polyimide Composite (1)

A polyamic acid composite containing a substance (M) that can release at least one metal selected from groups 1 and 2 of the periodic table as a metal ion (hereinafter also referred to as a polyamic acid composite (1)) and a polyimide composite containing the substance (M) (hereinafter referred to as a polyimide composite (1)) will be described below.

Diamines

Divalent diamines used as raw materials for a polyamic acid composite (1) and a polyimide composite (1) produced according to the present invention are not particularly limited provided that a polyamic acid or polyimide can be produced.

Examples of diamines include diamines having one benzene ring, such as p-phenylenediamine, m-phenylenediamine, p-xylylenediamine, and m-xylylenediamine;

diamines having two benzene rings, such as 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, and 1-(3-aminophenyl)-1-(4-aminophenyl)-1-phenylethane;

diamines having three benzene rings, such as 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyp)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, and 2,6-bis(3-aminophenoxy)pyridine;

diamines having four benzene rings, such as 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane;

diamines having five benzene rings, such as 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4(3-aminophenoxy)-α,α-dimethylbenzy]benzene, and 1,4-bis[4-(4-aminophenoxy)-α,α-dimethylbenzyl]benzene;

diamines having six benzene rings, such as 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, and 4,4'-bis[4-(4-aminophenoxy)phenoxy]diphenyl sulfone;

diamines having an aromatic substituent, such as 3,3'-diamino-4,4'-diphenoxybenzophenone, 3,3'-diamino-4,4'-dibiphenoxybenzophenone, 3,3'-diamino-4-phenoxybenzophenone, and 3,3'-diamino-4-biphenoxybenzophenone;

diamines having a spirobiindane ring, such as 6,6'-bis(3-aminophenoxy)-3,3,3',3'-tetramethyl-1,1'-spirobiindane, and 6,6'-bis(4-aminophenoxy)-3,3,3',3'-tetramethyl-1,1'-spirobiindane;

siloxane diamines, such as 1,3-bis(3-aminopropyl)tetramethyldisiloxane, 1,3-bis(4-aminobutyl)tetramethyldisiloxane, α,ω-bis(3-aminopropyl)polydimethylsiloxane, and αω-bis(3-aminobutyl)polydimethylsiloxane;

ethylene glycol diamines, such as bis(aminomethyl)ether, bis(2-aminoethyl)ether, bis(3-aminopropyl)ether, bis[(2-aminomethoxy)ethyl]ether, bis[2-(2-aminoethoxy)ethyl]ether, bis[2-(3aminoprotoxy)ethyl]ether 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, and triethylene glycol bis(3-aminopropyl)ether;

alkylenediamines, such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane; and alicyclic diamines, such as cyclobutanediamine, cyclohexanediamine, di(aminomethyl)cyclohexane [bis(aminomethyl)cyclohexanes, such as 1,4-bis(aminomethyl)cyclohexane], diaminobicycloheptane, diaminomethylbicycloheptane (including norbornanediamines, such as norbornanediamine), diaminooxybicycloheptane, diaminomethyloxybicycloheptane (including oxanorbornanediamine), isophoronediamine, diaminotricyclodecane, diaminomethyltricyclodecane, bis(aminocyclohexyl)methane [or methylenebis(cyclohexylamine)], and bis(aminocyclohexyl)isopropylidene.

In the case that the diamine is a compound containing an aromatic ring, such as a benzene ring, part or all of the hydrogen atoms on the aromatic ring may be substituted by a substituent selected from a fluoro group, a methyl group, a methoxy group, a trifluoromethyl group, and a trifluoromethoxy group.

Furthermore, in the case that the diamine is a compound containing an aromatic ring, such as a benzene ring, depending on the purpose, part or all of the hydrogen atoms on the aromatic ring may be substituted by a substituent serving as a crosslinking site selected from an ethynyl group, a benzocyclobuten-4'-yl group, a vinyl group, an allyl group, a cyano group, an isocyanate group, a nitrilo group, and an isopropenyl group.

In addition, depending on the purpose, diamines in which a group serving as a crosslinking site, such as a vinylene group, a vinylidene group, and an ethynylidene group, is incorporated into a main chain skeleton can be used.

These diamine compounds may be used alone or in combination.

A reduction in the number of carboxy groups in a repeating structure of a polyamic acid is related to a reduction in the number of crosslinking sites in the constitutional repeating unit. Thus, among the diamine compounds described above, diamine compounds containing up to four benzene rings and having an appropriate molecular weight are preferred.

Examples of such diamine compounds include diamines having one benzene ring, such as p-phenylenediamine, m-phenylenediamine, p-xylylenediamine, and m-xylylenediamine;

diamines having two benzene rings, such as 3,4'-diaminodiphenyl ether, 4,4'-diaminodiphenyl ether, 3,3'-diaminodiphenyl sulfide, 4,4'-diaminodiphenyl sulfide, 3,3'-diaminodiphenyl sulfone, 4,4'-diaminodiphenyl sulfone, 3,3'-diaminobenzophenone, 4,4'-diaminobenzophenone, 3,3'-diaminodiphenylmethane, 4,4'-diaminodiphenylmethane, 2,2-di(4-aminophenyl)propane, 2,2-di(3-aminophenyl)-1,1,1,3,3,3-hexafluoropropane, and 2,2-di(4-aminophenyl)-1,1,1,3,3,3-hexafluoropropane;

diamines having three benzene rings, such as 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, and 2,6-bis(3-aminophenoxy)pyridine;

diamines having four benzene rings, such as 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(4-aminophenoxy)phenyl]propane, and 2,2-bis[4-(4-aminophenoxy)phenyl]-1,1,1,3,3,3-hexafluoropropane;

ethylene glycol diamines, such as bis(aminomethyl)ether, bis(2-aminoethyl)ether, bis(3-aminopropyl)ether, bis[(2-aminomethoxy)ethyl]ether, bis[2-(2-aminoethoxy)ethyl]ether, bis[2-(3-aminoprotoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, and triethylene glycol bis(3-aminopropyl)ether;

alkylenediamines, such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane; and alicyclic diamines, such as cyclobutanediamine, cyclohexanediamine, di(aminomethyl)cyclohexane [bis(aminomethyl)cyclohexanes, such as 1,4-bis(aminomethyl)cyclohexane], diaminobicycloheptane, diaminomethylbicycloheptane (including norbornanediamines, such as norbornanediamine), diaminooxybicycloheptane, diaminomethyloxybicycloheptane (including oxanorbornanediamine), isophoronediamine, diaminotricyclodecane, diaminomethyltricyclodecane, bis(aminocyclohexyl)methane [or methylenebis(cyclohexylamine)], and bis(aminocyclohexyl)isopropylidene.

In particular, examples of diamine compounds that are important also from an industrial point of view include p-phenylenediamine, m-phenylenediamine, p-xylylenediamine, m-xylylenediamine, 4,4'-diaminodiphenyl ether, 4,4'-diaminodiphenyl sulfide, 4,4'-diaminodiphenyl sulfone, 2,2-di(4-aminophenyl)propane, 2,2-di(4-aminophenyl)-1,1,1,3,3,3-hexafluoropropane, 1,3-bis(3-aminophenoxy)benzene, 1,3-bis(4-aminophenoxy)benzene, 1,4-bis(4-aminophenoxy)benzene, 4,4'-bis(3-aminophenoxy)biphenyl, 4,4'-bis(4-aminophenoxy)biphenyl, bis(2-aminoethyl)ether, bis(3-aminopropyl)ether, 1,5-diaminopentane, 1,6-diaminohexane, cyclobutanediamine, cyclohexanediamine, di(aminomethyl)cyclohexane [bis(aminomethyl)cyclohexanes, such as 1,4-bis(aminomethyl)cyclohexane], diaminobicycloheptane, diaminomethylbicycloheptane (including norbornanediamines, such as norbornanediamine), diaminooxybicycloheptane, diaminomethyloxybicycloheptane (including oxanorbornanediamine), isophoronediamine, bis(aminocyclohexyl)methane [or methylenebis(cyclohexylamine)], and bis(aminocyclohexyl)isopropylidene.

Tetracarboxylic Acid Dianhydrides

Tetravalent tetracarboxylic acid dianhydrides used as raw materials for a polyamic acid composite (1) and a polyimide composite (1) produced according to the present invention are not particularly limited provided that a polyamic acid or polyimide can be produced.

Examples of such tetravalent tetracarboxylic acid dianhydrides include aromatic tetracarboxylic acid dianhydrides, such as pyromellitic acid dianhydride, 3,3',4,4'-biphenyltetracarboxylic acid dianhydride, 3,3',4,4'-benzophenonetetracarboxylic acid dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 2,3,6,7-naphthalenetetracarboxylic acid dianhydride, 1,4,5,8-naphthalenetetracarboxylic acid dianhydride, 2,2',3,3'-benzophenonetetracarboxylic acid dianhydride, 2,2',3,3'-biphenyltetracarboxylic acid dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl)ether dianhydride, bis(2,3-dicarboxyphenyl)sulfide dianhydride, bis(2,3-dicarboxyphenyl)sulfone dianhydride, 1,3-bis(2,3-dicarboxyphenoxy)benzene dianhydride, 1,4-bis(2,3-dicarboxyphenoxy)benzene dianhydride, and 1,2,5,6-naphthalenetetracarboxylic acid dianhydride, 1,3-bis(3,4-dicarboxybenzoyl)benzene dianhydride, 1,4-bis(3,4-dicarboxybenzoyl)benzene dianhydride, 1,3-bis(2,3-dicarboxybenzoyl)benzene dianhydride, 1,4-bis(2,3-dicarboxybenzoyl)benzene dianhydride 4,4'-isophthaloyldiphthalic anhydride diazodiphenylmethane-3,3',4,4'-tetracarboxylic acid dianhydride diazodiphenylmethane-2,2',3,3'-tetracarboxylic acid dianhydride 2,3,6,7-thioxanthonetetracarboxylic acid dianhydride, 2,3,6,7-anthraquinonetetracarboxylic acid dianhydride, 2,3,6,7-xanthonetetracarboxylic acid dianhydride, and ethylenetetracarboxylic acid dianhydride; and alicyclic tetracarboxylic acid dianhydrides, such as cyclobutanetetracarboxylic acid dianhydride, 1,2,3,4-cyclopentanetetracarboxylic acid dianhydride, 1,2,4,5-cyclohexanetetracarboxylic acid dianhydride, bicyclo[2.2.1]heptane-2,3,5,6-tetracarboxylic acid dianhydride, bicyclo[2.2.2]oct-7-ene-2,3,5,6-tetracarboxylic acid dianhydride, bicyclo[2.2.2]octane-2,3,5,6-tetracarboxylic acid dianhydride, 2,3,5-tricarboxycyclopentylacetic acid dianhydride, bicyclo[2.2.1]heptane-2,3,5-tricarboxylic acid-6-acetic acid dianhydride, 1-methyl-3-ethylcyclohex-1-ene-3-(1,2),5,6-tetracarboxylic acid dianhydride, decahydro-1,4,5,8-dimethanonaphthalene-2,3,6,7-tetracarboxylic acid dianhydride, 4-(2,5-dioxotetrahydrofuran-3-yl)-tetralin-1,2-dicarboxylic acid dianhydride, and 3,3',4,4'-dicyclohexyltetracarboxylic acid dianhydride.

In the case that the tetracarboxylic acid dianhydride is a compound containing an aromatic ring, such as a benzene ring, part or all of the hydrogen atoms on the aromatic ring may be substituted by a substituent selected from a fluoro group, a methyl group, a methoxy group, a trifluoromethyl group, and a trifluoromethoxy group.

Furthermore, in the case that the tetracarboxylic acid dianhydride is a compound containing an aromatic ring, such as a benzene ring, depending on the purpose, a tetracarboxylic acid dianhydride substituted by a substituent serving as a crosslinking site selected from an ethynyl group, a benzocyclobuten-4'-yl group, a vinyl group, an allyl group, a cyano group, an isocyanate group, a nitrilo group, and an isopropenyl group may be used.

In addition, tetracarboxylic acid dianhydrides in which a group serving as a crosslinking site, such as a vinylene group, a vinylidene group, and an ethynylidene group, is incorporated into a main chain skeleton can be used, preferably without impairing molding processability.

These tetracarboxylic acid dianhydrides may be used alone or in combination.

Part of tetracarboxylic acid dianhydride may be replaced with a hexacarboxylic acid trianhydride or an octacarboxylic acid tetraanhydride to introduce a branched chain.

A reduction in the number of carboxy groups in a repeating structure of a polyamic acid is related to a reduction in the number of crosslinking sites in the constitutional repeating unit. Thus, among the tetracarboxylic acid dianhydrides described above, tetracarboxylic acid dianhydrides that contain up to four benzene rings, have an appropriate molecular weight, and are particularly important also from an industrial point of view are preferred.

Examples of such tetracarboxylic acid dianhydrides include aromatic tetracarboxylic acid dianhydrides, such as pyromellitic acid dianhydride, 3,3',4,4'-biphenyltetracarboxylic acid dianhydride, 3,3',4,4'-benzophenonetetracarboxylic acid dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 2,3,6,7-naphthalenetetracarboxylic acid dianhydride, 2,2',3,3'-biphenyltetracarboxylic acid dianhydride, 2,2-bis(2,3-dicarboxyphenyl)-1,1,1,3,3,3-hexafluoropropane dianhydride, and 2,3,6,7-anthraquinonetetracarboxylic acid dianhydride; and alicyclic tetracarboxylic acid dianhydrides, such as cyclobutanetetracarboxylic acid dianhydride, 1,2,3,4-cyclopentanetetracarboxylic acid dianhydride, 1,2,4,5-cyclohexanetetracarboxylic acid dianhydride, bicyclo[2.2.1]heptane-2,3,5,6-tetracarboxylic acid dianhydride, bicyclo[2.2.2]oct-7-ene-2,3,5,6-tetracarboxylic acid dianhydride, bicyclo[2.2.2]octane-2,3,5,6-tetracarboxylic acid dianhydride, decahydro-1,4,5,8-dimethanonaphthalene-2,3,6,7-tetracarboxylic acid dianhydride, 4-(2,5-dioxotetrahydrofuran-3-yl)-tetralin-1,2-dicarboxylic acid dianhydride, and 3,3',4,4'-dicyclohexyltetracarboxylic acid dianhydride.

Examples of tetracarboxylic acid dianhydrides that are particularly important also from an industrial point of view include pyromellitic acid dianhydride, 3,3',4,4'-biphenyltetracarboxylic acid dianhydride, 3,3',4,4'-benzophenonetetracarboxylic acid dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, cyclobutanetetracarboxylic acid dianhydride, 1,2,3,4-cyclopentanetetracarboxylic acid dianhydride, 1,2,4,5-cyclohexanetetracarboxylic acid dianhydride, bicyclo[2.2.1]heptane-2,3,5,6-tetracarboxylic acid dianhydride, bicyclo[2.2.2.]oct-7-ene-2,3,5,6-tetracarboxylic acid dianhydride, and bicyclo[2.2.2]octane-2,3,5,6-tetracarboxylic acid dianhydride.

Solvents

Solvents used in the production of the polyimide composite (1) are not particularly limited provided that a polyamic acid formed can be dissolved in the solvents.

Examples of such solvents include phenol solvents, such as phenol, o-chlorophenol, m-chlorophenol, p-chlorophenol, o-cresol, m-cresol, p-cresol, 2,3-xylenol, 2,4-xylenol, 2,5-xylenol, 2,6-xylenol, 3,4-xylenol, and 3,5-xylenol;

aprotic amide solvents, such as N,N-dimethylformamide, N,N-dimethylacetamide, N,N-diethylacetamide, N-methyl-2-pyrrolidone, 1,3-dimethyl-2-imidazolidinone, N-methylcaprolactam, and hexamethylphosphorotriamide;

ether solvents, such as 1,2-dimethoxyethane, bis(2-methoxyethyl)ether, 1,2-bis(2-methoxyethoxy)ethane, tetrahydrofuran, bis[2-(2-methoxyethoxy)ethyl]ether, and 1,4-dioxane;

amine-based solvents, such as pyridine, quinoline, isoquinoline, α-picoline, β-picoline, γ-picoline, isophorone, piperidine, 2,4-lutidine, 2,6-lutidine, trimethylamine, triethylamine, tripropylamine, and tributylamine; and other solvents, such as dimethyl sulfoxide, dimethyl sulfone, diphenyl ether, sulfolane, diphenyl sulfone, tetramethylurea, anisole, water, benzene, toluene, o-xylene, m-xylene, p-xylene, chlorobenzene, o-dichlorobenzene, m-dichlorobenzene, p-dichlorobenzene, bromobenzene, o-dibromobenzene, m-dibromobenzene, p-dibromobenzene, o-chlorotoluene, m-chlorotoluene, p-chlorotoluene, o-bromotoluene, m-bromotoluene, p-bromotoluene, acetone, methyl ethyl ketone, methyl isobutyl ketone, cyclopentanone, cyclohexanone, methanol, ethanol, propanol, isopropanol, butanol, isobutanol, pentane, hexane, heptane, cyclohexane, dichloromethane, chloroform, carbon tetrachloride, fluorobenzene, methyl acetate, ethyl acetate, butyl acetate, methyl formate, and ethyl formate.

These solvents may be used alone or in combination.

Among the solvents described above, aprotic amide solvents are preferred, and N,N-dimethylformamide, N,N-dimethylacetamide, N,N-diethylacetamide, N-methyl-2-pyrrolidone, 1,3-dimethyl-2-imidazolidinone, N-methylcaprolactam, and hexamethylphosphorotriamide are more preferred.

Production of Polyamic acid Solution (S1)

A method for producing a polyamic acid solution (S1) (a polyamic acid varnish) containing a polyamic acid and a solvent used in the present invention is not particularly limited provided that the polyamic acid can be produced.

In general, the polyamic acid solution (S1) is produced by polymerizing the diamine [1] and the tetracarboxylic acid dianhydride [2] in a solvent, typically an aprotic polar solvent.

In the polymerization reaction, the raw materials may be added to a polymerization reaction system by any method. Examples of the method include a) a method in which a diamine compound [1], a tetracarboxylic acid dianhydride [2], and a solvent are added' simultaneously, b) a method in which a diamine compound [1] and a solvent are mixed before the addition of a tetracarboxylic acid dianhydride [2], c) a method in which a tetracarboxylic acid dianhydride [2] and a solvent are mixed before the addition of a diamine compound [1], and d) a method in which a mixture of a tetracarboxylic acid dianhydride [2] and a solvent and a mixture of a diamine compound [1] and the solvent are mixed.

In the production of a polyamic acid or polyimide, the weight ratio of the tetracarboxylic acid dianhydride to the diamine compound is generally adjusted to control the molecular weight of the resulting polyamic acid or polyimide.

In the production of the polyamic acid, the molar ratio of all the tetracarboxylic acid dianhydrides to all the diamine compounds (all the tetracarboxylic acid dianhydrides/all the diamine compounds) generally ranges from 0.9 to 1.1.

When the molar ratio of all the acid dianhydrides to all the diamine compounds ranges from 0.9 to 1.1, a polyamic acid having a logarithmic viscosity in the range of 0.1 to 3.0 dL/g, as measured in N,N-dimethylacetamide (DMAc) at a concentration of 0.5 g/dl at 35° C., can be produced.

A polyimide contained in a polyimide composite (1) produced according to the present invention and its polyimide precursor (that is, a polyamic acid) may be blocked at their molecular ends. In that case, as already known, it is desirable that molecular ends be blocked with a group that has no reactivity to amines or dicarboxylic acid anhydrides.

More specifically, it is desirable that molecular ends of a polyimide and a polyamic acid be blocked with a dicarboxylic acid anhydride or a monoamine compound.

Molecular ends of a polyamic acid or polyimide are blocked in the following two ways. In the case that the amount of diamine compound is excessive and molecular ends are blocked with a dicarboxylic acid anhydride, a tetracarboxylic acid dianhydride is 0.9 mol or more but less than 1.0 mol, and the dicarboxylic acid anhydride is 0.001 mol or more but less than 0.3 mol, on the basis of 1 mol of the diamine compound. In the case that the amount of tetracarboxylic acid dianhydride is excessive and molecular ends are blocked with a monoamine compound, a diamine compound is 0.9 mol or more but less than 1.0 mol, and the monoamine compound is 0.001 mol or more but less than 0.3 mol, on the basis of 1 mol of the tetracarboxylic acid dianhydride.

In the case that the polyamic acid or polyimide is a copolymer, at least two kinds of constitutional repeating units of the copolymer may be ordered or regulated, or not. The type of the copolymer may be random, alternating, or block. Thus, if the diamine and the tetracarboxylic acid dianhydride contain three or more raw materials in total, these raw materials may be added at the same time or in portions in any order.

A polyamic acid (polyimide precursor) produced by such a polymerization reaction has a structure having the following general formula (1).

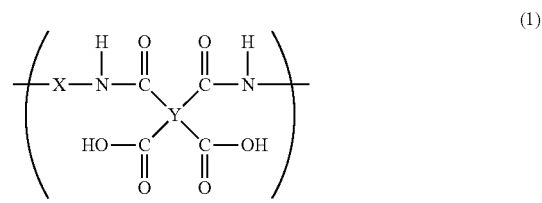

(wherein X denotes a divalent organic group, and Y denotes a tetravalent organic group)

The concentration of polyamic acid in the polyamic acid solution (S1) is not particularly limited. In general, the polyamic acid solution (S1) contains 100 to 1000 parts by weight of the solvent per 100 parts by weight of the polyamic acid.

Substance (M) that Releases Metal Ion

A substance (M) that can release at least one metal selected from groups 1 and 2 of the periodic table as a metal ion (hereinafter also referred to simply as a "substance (M) that can release a metal ion") is added to the solution (S1) containing a polyamic acid thus produced to produce a polyamic acid solution (S2) according to the present invention.

Examples of the substance (M) that can release a metal ion include metallic compounds, such as metal oxides, metal hydroxides, inorganic acid metal salts, organic acid metal salts, metal complexes containing organic ligands, and metal alkoxides.

A metallic element contained in the substance (M) that can release a metal ion is an alkali metal or an alkaline earth metal. The metallic element therefore has a relatively low electronegativity as compared with other metals and is expected to form an ionic bond with an oxygen atom, which has a high electronegativity. In fact, when a substance (M) that releases a metal ion is added to a polyamic acid solution (S1) and is mixed such that the conditions defined by the present invention are satisfied, an increase in the viscosity of the polyamic acid solution (S1) can be observed. Although the cause of this viscosity increase is not clear, a carboxy (COOH) group in a polyamic acid contained in the polyamic acid solution (S1) and the substance (M) that releases a metal ion may cause some type of ionic interaction, for example, ionic bonding and form a cross-linked structure between polymer molecules through the metal ion, thereby increasing the heat resistance, for example, the glass transition temperature of the finally produced polyimide composite.

Examples of the substance that releases a metal ion include the following substances.

Group IA

Na:

sodium oxide; sodium hydroxide; inorganic acid salts, such as sodium carbonate and sodium dihydrogen phosphate; organic acid salts, such as sodium acetate, sodium citrate, sodium cyclohexanebutyrate, sodium formate, sodium oxalate, sodium succinate, sodium tartrate, sodium gluconate, sodium aspartate, sodium malonate, sodium hyaluronate, sodium benzoate, sodium oleate, sodium sorbate, and sodium glutamate; complexes, such as disodium ethylenediaminetetraacetate; and metal alkoxides, such as sodium methoxide and sodium ethoxide

K:

potassium hydroxide; inorganic acid salts, such as potassium carbonate, potassium hydrogen carbonate, and potassium hydrogen phosphate; organic acid salts, such as potassium phthalimide, potassium acetate, potassium gluconate, potassium methanesulfonate, potassium 2-amino-5-nitrobenzoate, potassium aspartate, potassium ethyl malonate, potassium glutamate, potassium hyaluronate, potassium indole-3-acetate, potassium 1-naphthol-2-sulfonate, potassium oleate, potassium benzoate, potassium 2-ethylhexanoate, potassium formate, potassium oxalate, potassium palmitate, potassium acetylacetonate, potassium sorbate, potassium tartrate, potassium trifluoroacetate, tripotassium citrate, and potassium 2,4,5-trichlorobenzenesulfonate; complexes, such as dipotassium ethylenediaminetetraacetate; and metal alkoxides, such as potassium methoxide and potassium ethoxide Group IIA Be;

beryllium oxide; and organic acid salts, such as beryllium acetylacetonate and beryllium oxalate Mg;

magnesium oxide; magnesium hydroxide; inorganic acid salts, such as magnesium carbonate and magnesium phosphate; organic acid salts, such as magnesium acetylacetonate, magnesium hexafluoroacetylacetonate, magnesium phthalocyanine, bis(ethylcyclopentadienyl)magnesium, magnesium benzoate, magnesium citrate, magnesium cyclohexanebutyrate, magnesium dimethacrylate, magnesium formate, magnesium lactate, magnesium methacrylate, magnesium nicotinate, magnesium myristate, magnesium oxalate, magnesium salicylate, magnesium stearate, magnesium succinate, magnesium trifluoromethanesulfonate, magnesium acetate, magnesium lactate, magnesium naphthenate, and magnesium oxalate; complexes, such as (N,N,N',N'-tetramethylethylenediamine)bismagnesium; and metal alkoxides, such as magnesium methoxide and magnesium ethoxide Ca;

calcium oxide; calcium hydroxide; inorganic acid salts, such as calcium carbonate, calcium chloride, calcium fluoride, calcium iodate, calcium iodide, calcium metaphosphate, calcium phosphate, and calcium silicate; organic acid salts, such as calcium acetylacetonate, calcium acetate, calcium ascorbate, calcium aspartate, calcium benzoate, calcium benzyl phthalate, calcium bromate, calcium formate, calcium fumarate, calcium glycolate, calcium heptanoate, calcium laurate, calcium pantothenate, calcium stearate, calcium trifluoromethanesulfonate, calcium saccharate, calcium citrate, calcium gluconate, hexafluoroacetylacetonate calcium, calcium oxalate, calcium pyruvate, calcium lactate, calcium salicylate, and calcium methacrylate; and metal alkoxides, such as calcium methoxide Sr;

strontium hydroxide; inorganic acid salts, such as strontium carbonate and strontium iodate; organic acid salts, such as strontium acetate, strontium formate, strontium lactate, strontium cyclohexanebutyrate, strontium 2-ethylhexanoate, and strontium oxalate; and complexes, such as bis(N,N,N',N',N''-pentamethyldiethylenetriamine)bisstrontium Ba;

barium oxide; barium hydroxide; inorganic acid salts, such as barium carbonate and barium phosphate; organic acid salts, such as barium acetate, barium cyclohexanebutyrate, barium formate, barium lactate, barium laurate, barium oleate, barium oxalate, barium stearate, barium tartrate, barium trifluoromethanesulfonate, barium gluconate, barium 2-ethylhexanoate, and barium stearate; and complexes, such as bis(n-propyltetramethylcyclopentadienyl)barium Compounds containing a plurality of metallic elements of groups IA and IIA, for example, oxides, such as aluminum calcium oxide, metal alkoxides, such as aluminum magnesium isopropoxide, and complexes, such as dipotassium magnesium ethylenediaminetetraacetate may also be used.

Among these substances that release a metal ion, at least one substance selected from the following 1) to 4) is preferred.

1) A metal oxide (M-b) containing at least one metal selected from Mg, Ca, and K, 2) a metal hydroxide (M-c) containing at least one metal selected from Na, K, Mg, Ca, Sr, and Ba, 3) an inorganic or organic acid metal salt (M-d) containing at least one metal selected from Na, K, Mg, Ca, Sr, and Ba, and 4) a metal complex (M-e) containing at least one metal selected from Na, K, Mg, Ca, Sr, and Ba and an organic ligand.

Examples of the metal oxide (M-b) include magnesium oxide, calcium oxide, potassium oxide, and aluminum calcium oxide. Among these metal oxides, magnesium oxide and calcium oxide are preferred.

Examples of the metal hydroxide (M-c) include the hydroxides exemplified above for each metal.

Examples of the inorganic or organic acid metal salt (M-d) include the inorganic and organic acid salts exemplified above for each metal.

Examples of the metal complex (M-e) include the metal complexes exemplified above for each metal and dipotassium magnesium ethylenediaminetetraacetate.

The metal oxide (M-b) has an ionic interaction with a carboxy group and tends to form a certain structure resulting from the ionic interaction. In the presence of a minute amount of water contained in a polyamic acid solution, the metal oxide (M-b) is generally allowed to react with water to yield the corresponding hydroxide, which is classified into the metal hydroxide (M-c).

As described above, the metal hydroxide (M-c) tends to form an ionic bond with a carboxy group of a polyamic acid while forming water.

If the substance that releases a metal ion is the inorganic or organic acid metal salt (M-d) and the metal complex (M-e), since a metal in the compound has an ionic bonding ability, the substance can also easily form an ionic bond with a carboxy group of a polyamic acid.

For the same anion with which metals form ionic bonds, the ionic bonding abilities of the metals serving as cations depend on their electronegativities. Group 1 or 2 of the periodic table, that is, alkali metals or alkaline earth metals have low electronegativities and high ionic bonding abilities. Transition metals have relatively high electronegativities and low ionic bonding abilities. Different metals have different ionic radii. In a certain group of the periodic table, the ionic radius increases with the atomic number. The electronegativity and the ionic radius are related to the ionic bonding strength between a carboxy group of a polyamic acid and a substance that releases a metal ion and, in combination with the solubility of the substance that releases a metal ion in a polyamic acid solution, produce effects of improving the heat resistance of a polyimide composite according to the present invention. In view of these, calcium hydroxide, which can release a calcium ion and has a high solubility in a polyamic acid solution, is particularly preferred. In order to increase its solubility, it is effective to increase the surface area of a substance that releases a metal ion, and the substance that releases a metal ion is preferably as small as possible before being added to a polyamic acid solution.

The metal hydroxide (M-c) is preferred in terms of the rapid formation of an ionic interaction structure with a carboxy group of a polyamic acid.

These substances that release a metal ion may be used alone or in combination.

Production of Polyamic Acid Solution (S2)

A polyamic acid solution (S2) (a composite varnish) is produced by mixing 1 to 30 equivalents of a substance that releases a metal ion per 100 equivalents of a constitutional repeating unit of a polyamic acid having the formula (1) with a polyamic acid solution (S1) containing the polyamic acid and a solvent.

A carboxy (COOH) group of a polyimide precursor polyamic acid can release a proton ($H^+$) to form a carboxylate anion. Thus, a certain structure resulting from an ionic interaction, for example, an ionic bond can be formed between a polyamic acid and a cation, for example, a metal cation. In contrast, since polyimides generally have no carboxy (COOH) group, the simple addition of a cation, for example, a metal cation to a polyimide rarely forms such a structure based on ionic interaction. Thus, unlike the present invention, an improvement in heat resistance cannot be expected.

The addition of a smaller amount of substance (M) that releases a metal ion than the range described above has a little effect of improving the glass transition temperature. On the other hand, the addition of a larger amount of substance that releases a metal ion than the range described above results in a decrease in the mechanical strength of the finally produced polyimide composite, causing practical difficulties.

The mixing method of a substance (M) that releases a metal ion is not particularly limited and can generally involve the use of an apparatus, such as a mixer or a blender.

It is desirable that the mixing be performed at a temperature in the range of approximately 0° C. to 50° C. to prevent the imidization of polyamic acid.

The solution viscosity (V2) of the polyamic acid solution (S2) described above and the solution viscosity (V1) of a polyamic acid solution (S1) (E-type viscosity measured at 25° C.) before the addition of a substance (M) that can release a metal ion satisfy the following formula (I).

$$(V2/V1) \times 100 \geq 120\% \qquad (I)$$

The imidization of a polyamic acid composite (PAAC) (1) contained in a polyamic acid solution (S2) satisfying the relation of the formula (I) can produce a polyimide composite (1) that has an improved glass transition temperature and a reduced coefficient of linear expansion without impairing the optical properties of the polyimide.

Although there is no clear detailed mechanism for the improvement of the physical properties of a polyimide composite (1) produced from a polyamic acid solution (S2) satisfying the relation of the formula (I), it is assumed that a structure based on ionic interaction, for example, an ionic bond formed between a carboxy (COOH) group of the polyamic acid and a substance (M) that can release a metal ion allows a cross-linked structure to be formed between polymer chains of the polyamic acid, thus increasing the solution viscosity as defined by the formula (I). Because of the structure thus formed, the polyimide composite (PIC) (1) produced by the imidization of the polyamic acid composite (PAAC) (1) probably has the physical properties described above.

In the production of a polyamic acid solution (S2) satisfying the relation of the formula (I), a substance (M) that releases a metal ion may be added by any method, including direct addition. Preferably, a substance (M) that releases a metal ion is pulverized, and the pulverized product is added. Preferably, before the addition, a substance that releases a metal ion is dissolved or dispersed in a solvent that is inert to the polyamic acid solution (S1).

A polyamic acid solution (S2) satisfying the relation of the formula (I) is generally produced at about room temperature, preferably at a temperature in the range of 10° C. to 40° C.

In the production of a polyamic acid solution (S2) satisfying the relation of the formula (I), agitation is performed for 30 minutes to 24 hours, preferably one hour to 20 hours.

While agitation is performed in the production of a polyamic acid solution (S2), agitation is preferably performed sufficiently to produce a polyamic acid solution (S2) satisfying the relation of the formula (I). For example, for agitation with an impeller, agitation is generally performed at 5 to 400 rpm, preferably at 10 to 100 rpm.

A polyamic acid solution (S2) may be produced in any atmosphere, for example, in the air or in an inert atmosphere, such as nitrogen.

If necessary, the resulting polyamic acid solution (S2) may be filtered to remove impurities and insoluble components. Filtration may be pressure filtration using tetrafluoroethylene resin (PTFE) filter paper.

After an additive agent, filler, and/or the like is added to the resulting polyamic acid solution (S2) without compromising the advantages of the present invention, a polyimide composite (PIC) described below may be produced.

Examples of the additive agent include abrasion resistance improvers, such as graphite, Carborundum, molybdenum disulfide, and fluorocarbon resins, flame resistance improvers, such as antimony trioxide, electrical characteristics improvers, such as clay, mica, and kaolin, tracking resistance improvers, such as asbestos, silica, and graphite, acid resistance improvers, such as silica and calcium metasilicate, thermal conductivity improvers, such as iron powder, zinc powder, and aluminum powder, and others, such as glass beads, glass spheres, glass fiber, talc, diatomaceous earth, alumina, alumina hydrate, titania, shirasu (a type of light gray volcanic ash) balloons, colorants, and pigments.

Solvent removal under conditions where a polyamic acid composite (PACC) (1) contained in the polyamic acid solution (S2) described above is not imidized can yield a polyamic acid composite (PAAC) (1) according to the present invention.

Examples of the method for removing a solvent from a polyamic acid solution (S2) to produce a polyamic acid composite (PAAC) (1) include a reprecipitation method in which a poor solvent that does not dissolve the polyamic acid composite (PAAC) (1) is added to the polyamic acid solution (S2) to precipitate the polyamic acid composite (PAAC) (1) and a vacuum drying method in which a solvent is evaporated under reduced pressure.

Production of Polyimide Composite (PIC) (1)

A polyimide composite (PIC) (1) according to the present invention can be produced by the imidization of a polyamic acid (PAAC) contained in the polyamic acid solution (S2) described above simultaneously with or followed by solvent removal. Alternatively, a polyimide composite (PIC) (1) can be produced using a varnish containing the polyamic acid (PAAC) described above instead of the polyamic acid solution (S2) described above following the same procedures.

Examples of the imidization include thermal imidization and chemical imidization. These imidization methods may be performed in combination.

The thermal imidization can generally be performed by heating at a temperature in the range of 150° C. to 300° C. for 30 minutes to 4 hours. The chemical imidization is performed using an imidizing agent, such as acetic anhydride.

Imidization may be performed in any atmosphere, for example, in the air or in an inert atmosphere, such as nitrogen.

Such imidization yields a polyimide composite (PIC) (1) according to the present invention. A polyimide contained in the polyimide composite (1) has a constitutional repeating unit having the following formula (2).

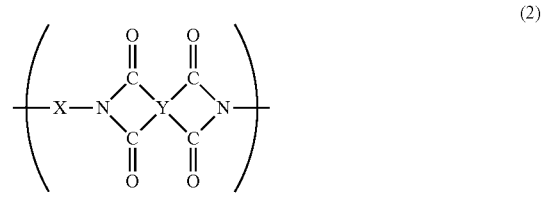

(wherein X denotes a divalent organic group, and Y denotes a tetravalent organic group)

The imidization described above allows a structure based on an ionic interaction between a carboxy group of a polyamic acid in a polyamic acid solution (S2) and a metal cation in a substance (M) that can release a metal ion to be formed in a firmer form in a polyimide composite (1).

Although there is no clear detailed mechanism for the formation of the structure, it is assumed that reaction conditions for imidization are suitable to strengthen the ionic interaction and, even if an interaction between a substance (M) that can release a metal ion and a carboxy group of a polyamic acid is not sufficiently formed in a polyamic acid solution (S2), the substance (M) that can release a metal ion is easily converted into a substance having a stronger ionic interaction with the carboxy group by the action of water formed by imidization. Thus, the structure based on the ionic interaction can be formed more firmly in a polyimide composite (1).

Solvent removal can be performed, for example, by heating and, if necessary, under reduced pressure. Solvent removal may be performed simultaneously with or after the imidization. If a solvent cannot be sufficiently removed simultaneously with the imidization, the solvent may be further removed after the imidization.

Solvent removal can generally be performed by heating at a temperature in the range of 150° C. to 300° C. for 30 minutes to 4 hours. Solvent removal may be performed in any heating atmosphere, for example, under reduced pressure, in the air, or in an inert atmosphere, such as nitrogen.

For thermal imidization, a solvent may be removed simultaneously with heating in the thermal imidization. If a solvent cannot be sufficiently removed during imidization, the solvent may be removed by heating at a temperature in the range of 150° C. to 300° C.

For chemical imidization, a solvent can generally be removed by heating at a temperature in the range of 150° C. to 300° C. for 30 minutes to 4 hours after the chemical imidization.

The glass transition point (Tg2) of a polyimide composite (PIC) (1) produced according to the present invention is generally higher than the glass transition point (Tg1) of the polyimide alone by 5 K or more, preferably 10 K or more. While the effect of increasing Tg depends on the structure of a polyimide resin, this effect is produced even in a polyimide having a glass transition temperature as high as 300° C. or more.

The introduction of a cross-linked structure based on a carbon-carbon covalent bond into a polyimide may improve the heat resistance and the glass transition point of the polyimide to some extent. However, it is generally difficult to improve the heat resistance and the glass transition point of a polyimide having a glass transition temperature of 300° C. or more by the introduction of such a cross-linked structure. Furthermore, as compared with a polyimide alone, a polyimide composite (PIC) (1) according to the present invention remains transparent and has a reduced coefficient of thermal linear expansion.

A polyimide composite (PIC) (1) produced according to the present invention preferably has a Tg of 200° C. or more, more preferably 270° C. or more. A polyimide composite (PIC) (1) having a Tg below the Tg described above may have insufficient resistance to heat treatment during processing.

A polyimide composite (1) produced according to the present invention generally contains 1 to 30 equivalents of at least one metal selected from groups 1 and 2 of the periodic table per 100 equivalents of a constitutional repeating unit of a polyimide having the formula (2).

A polyimide composite (1) according to the present invention thus produced can be widely applied to members that require high heat resistance and a low coefficient of linear expansion.

For example, a polyimide composite (1) produced according to the present invention can be used as a film or as a metal laminate having at least one layer formed of the polyimide composite (1).

A polyimide composite film manufactured from a polyimide composite (1) according to the present invention generally has a thickness in the range of several micrometers to several hundred micrometers. A film having such a thickness can be manufactured by the application of the polyamic acid solution (S2) described above or a coating material containing the polyamic acid composite (PAAC) (1) described above at a thickness in the range of 10 to 1000 μm followed by imidization and solvent removal. The concentration of polyamic acid composite (PAAC) (1) in the coating material and the contents of other components can be appropriately determined for each application.

Manufacturing conditions for a formed product, such as a film, can be appropriately determined in accordance with the film thickness and the shape of the formed product.

In a polyimide composite film manufactured from a polyimide composite (1) according to the present invention, a colorless and transparent film can be manufactured from a colorless and transparent polyimide. For example, colorless and transparent films can be used in optical materials, cover materials for photosensitive resins, display material members, such as displays and flexible displays, transparent rigid and flexible circuit boards, and protective films for solar cells.

The production of a colorless and transparent polyimide can involves the production of a polyamic acid solution (S2) using a combination of an alicyclic diamine and an aromatic tetracarboxylic acid dianhydride, for example, norbornanediamine or bis(aminomethyl)cyclohexane as the diamine and pyromellitic acid dianhydride or 3,3',4,4'-biphenyltetracarboxylic acid dianhydride as the tetracarboxylic acid dianhydride, or a combination of an aromatic diamine and an alicyclic tetracarboxylic acid dianhydride, for example, 4,4'-oxydianiline or 1,3-bis(3,3'-aminophenoxy)benzene as the diamine and 1,2,4,5-cyclohexanetetracarboxylic acid dianhydride as the tetracarboxylic acid dianhydride, and imidization of the polyamic acid solution (S2).

The term "colorless and transparent" described above means that the light transmittance of a film having a thickness of 50 μm in a visible light region at a wavelength of 400 nm or more, preferably in the range of 400 to 800 nm, generally ranges from 80% to 100%, preferably 85% to 100%. A material having a light transmittance below the range described above cannot basically be used in members that require "colorless and transparent".

The term "transparent" described above means that, on the basis of the total light transmittance, the total light transmittance is 80% or more. A material having a total light transmittance below 80% cannot basically be used in members that require "colorless and transparent".

A polyimide composite (1) produced according to the present invention can be used in coating materials of wires, tubular molded products, and laminates, for example.

Polyamic Acid Composite (2) and Polyimide Composite (2)

A polyamic acid composite containing a substance (m) containing a substance (M) that can release at least one metal selected from groups 1 and 2 of the periodic table as a metal ion (hereinafter also referred to as a polyamic acid composite (2)) and a polyimide composite containing the substance (M) (hereinafter referred to as a polyimide composite (2)) will be described below.

A polyimide used in a polyamic acid composite (2) and a polyimide composite (2) according to the present invention has a constitutional repeating unit having the following general formula (2).

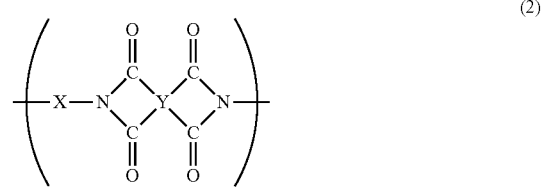

(In the formula (2), X denotes a divalent organic group, and Y denotes a tetravalent organic group.)

Examples of the polyimide described above include colorless and transparent polyimides having a semi-alicyclic repeating structure expressed by the following general formula (2B).

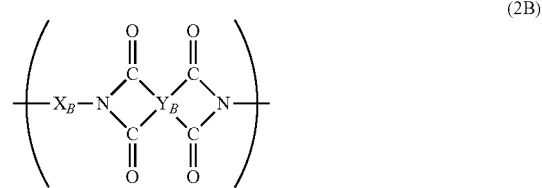

(In the formula (2B), $X_B$ denotes a divalent aromatic group containing 6 to 51 carbon atoms, and $Y_B$ denotes a tetravalent alicyclic group containing 4 to 12 carbon atoms.)

A polyimide having a repeating structure expressed by the formula (2B) according to the present invention is formed by a reaction between a divalent aromatic diamine compound [1] and a tetravalent alicyclic tetracarboxylic acid dianhydride compound [2'].

Examples of the polyimide described above include colorless and transparent polyimides having an alicyclic repeating structure expressed by the following general formula (2C).

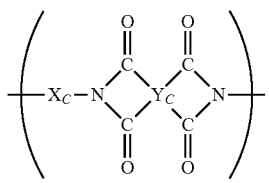
(2C)

(In the formula (2C), $X_C$ denotes a divalent alicyclic group containing 4 to 15 carbon atoms, and $Y_C$ denotes a tetravalent alicyclic group containing 4 to 12 carbon atoms.)

A polyimide having a repeating structure expressed by the formula (2C) according to the present invention is formed by a reaction between a divalent alicyclic diamine compound [1'] and a tetravalent alicyclic tetracarboxylic acid dianhydride compound [2'].

Examples of the polyimide described above include aromatic polyimides having a wholly aromatic repeating structure expressed by the following general formula (2D).

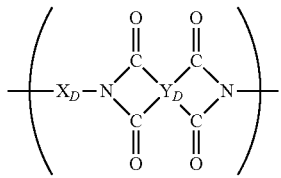
(2D)

(In the formula (2D), $X_D$ denotes a divalent aromatic group containing 6 to 51 carbon atoms, and $Y_D$ denotes a tetravalent aromatic group containing 6 to 27 carbon atoms.)

A polyimide having a repeating structure expressed by the formula (2D) according to the present invention is formed by a reaction between a divalent aromatic diamine compound [1] and a tetravalent aromatic tetracarboxylic acid dianhydride compound [2].

Examples of the polyimide described above include colorless and transparent polyimides having a semi-alicyclic repeating structure expressed by the following general formula (2E).

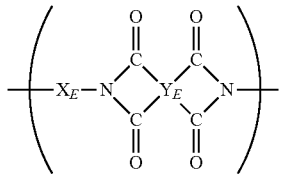
(2E)

(In the formula (2E), $X_E$ denotes a divalent alicyclic group containing 4 to 15 carbon atoms, and $Y_E$ denotes a tetravalent aromatic group containing 6 to 27 carbon atoms.)

A polyimide having a repeating structure expressed by the formula (2E) according to the present invention is formed by a reaction between a divalent alicyclic diamine compound [1'] and a tetravalent aromatic tetracarboxylic acid dianhydride compound [2].

$X_B$ in the repeating structure having the general formula (2B) is derived from the divalent aromatic diamine compound [1]. $X_D$ in the repeating structure having the general formula (2D) is also derived from the divalent aromatic diamine compound [1]. The divalent aromatic diamine compound [1] may be any diamine compound having an aromatic structure.

Examples of such a diamine compound include diamine compounds having the following divalent aromatic groups.

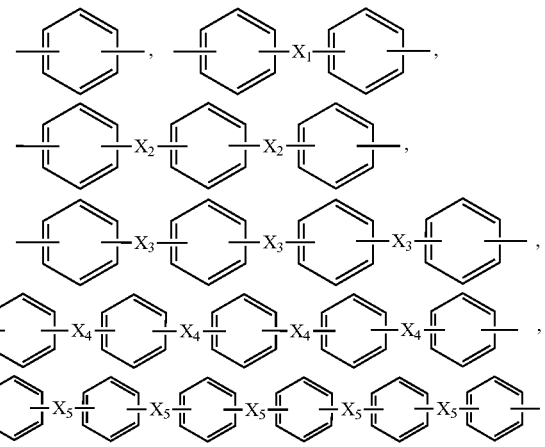

(wherein $X_1$ to $X_5$ are selected from

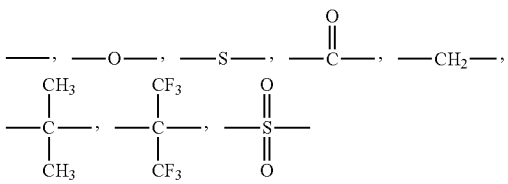

and $X_2$ to $X_5$ may be the same or different from one another)

Specific examples of the divalent aromatic diamine compound [1] include

A) divalent aromatic diamine compounds having one benzene ring, such as p-phenylenediamine and m-phenylenediamine, B) divalent aromatic diamine compounds having two benzene rings, such as 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, and 1-(3-aminophenyl)-1-(4-aminophenyl)-1-phenylethane, C) divalent aromatic diamine compounds having three benzene rings, such as 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)

benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, and 2,6-bis(3-aminophenoxy)pyridine, D) divalent aromatic diamine compounds having four benzene rings, such as 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane, E) divalent aromatic diamine compounds having five benzene rings, such as 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, and 1,4-bis[4-(4-aminophenoxy)-α,α-dimethylbenzyl]benzene, and F) divalent aromatic diamine compounds having six benzene rings, such as 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, and 4,4'-bis[4-(4-aminophenoxy)phenoxy]diphenyl sulfone.

$X_C$ in the repeating structure having the general formula (2C) is derived from the divalent alicyclic diamine compound [1']. $X_E$ in the repeating structure having the general formula (2E) is also derived from the divalent alicyclic diamine compound [1']. The divalent alicyclic diamine compound [1'] may be any diamine compound having an alicyclic structure.

Specific examples of the divalent alicyclic diamine compound [1'] include cyclobutanediamines, cyclohexanediamines, di(aminomethyl)cyclohexanes (bis(aminomethyl)cyclohexanes, such as 1,3-bis(aminomethyl)cyclohexane), diaminobicycloheptanes, diaminomethylbicycloheptanes (including norbornanediamines, such as norbornanediamine), diaminooxybicycloheptanes, diaminomethyloxybicycloheptanes (including oxanorbornanediamines), isophoronediamines, diaminotricyclodecanes, diaminomethyltricyclodecanes, bis(aminocyclohexyl)methanes (methylenebis(cyclohexylamine)s, such as 4,4'-methylenebis(cyclohexylamine)), and bis(aminocyclohexyl)isopropylidenes.

These diamine compounds may be used in combination.

$Y_D$ in the repeating structure having the general formula (2D) is derived from the tetravalent aromatic tetracarboxylic acid dianhydride compound [2]. $Y_E$ in the repeating structure having the general formula (2E) is also derived from the tetravalent aromatic tetracarboxylic acid dianhydride compound [2]. The tetravalent aromatic tetracarboxylic acid dianhydride may be any tetracarboxylic acid dianhydride having an aromatic ring structure.

Specific examples of the tetravalent aromatic tetracarboxylic acid dianhydride compound [2] include pyromellitic acid dianhydrides, biphenyltetracarboxylic acid dianhydrides, benzophenonetetracarboxylic acid dianhydrides, such as 3,3',4,4'-benzophenonetetracarboxylic acid dianhydride, bis(dicarboxyphenyl)ether dianhydrides, bis(carboxyphenyl)ester dianhydrides, and bis(dicarboxyphenyl)hexafluoropropane dianhydrides.

$Y_B$ in the repeating structure having the general formula (2B) is derived from the tetravalent alicyclic tetracarboxylic acid dianhydride compound [2']. $Y_C$ in the repeating structure having the general formula (2C) is also derived from the tetravalent alicyclic tetracarboxylic acid dianhydride compound [2']. The tetravalent alicyclic tetracarboxylic acid dianhydride may be any tetracarboxylic acid dianhydride having an alicyclic structure.

Specific examples of the tetravalent alicyclic tetracarboxylic acid dianhydride compound [2'] include cyclobutanetetracarboxylic acid dianhydride, 1,2,3,4-cyclopentanetetracarboxylic acid dianhydride, 1,2,4,5-cyclohexanetetracarboxylic acid dianhydride, bicyclo[2.2.1]heptane-2,3,5,6-tetracarboxylic acid dianhydride, bicyclo[2.2.2]oct-7-ene-2,3,5,6-tetracarboxylic acid dianhydride, bicyclo[2.2.2]octane-2,3,5,6-tetracarboxylic acid dianhydride, 2,3,5-tricarboxycyclopentylacetic acid dianhydride, bicyclo[2.2.1]heptane-2,3,5-tricarboxylic acid-6-acetic acid dianhydride, 1-methyl-3-ethylcyclohex-1-ene-3-(1,2),5,6-tetracarboxylic acid dianhydride, decahydro-1,4,5,8-dimethanonaphthalene-2,3,6,7-tetracarboxylic acid dianhydride, 4-(2,5-dioxotetrahydrofuran-3-yl)-tetralin-1,2-dicarboxylic acid dianhydride, and 3,3',4,4'-dicyclohexyltetracarboxylic acid dianhydride.

In a polyamic acid composite (2) and a polyimide composite (2) according to the present invention, a substance (m) containing a substance (M) that can release at least one metal selected from groups 1 and 2 of the periodic table as a metal ion is used.

Examples of the substance (m) that can contain the substance (M) include talc. Talc, also referred to as talcum, is mineral mainly composed of magnesium hydroxide and a silicate. Talc generally has a flat structure. Talc has a general composition formula of $Mg_3Si_4O_{10}(OH)_2$ and is white or light green. The degree of whiteness increases with the purity of talc. Talc has a crystal structure of a monoclinic or triclinic system composed of fine flaky crystals and tends to be completely cleaved in one direction by an external force.

Among various types of talc described above, talc containing a substance that can release a metal ion as a trace constituent is preferred. Use of such talc as a raw material further strengthens the tendency to reduce the coefficient of linear expansion and the tendency to increase the glass transition temperature of a polyimide without impairing the intrinsic heat resistance and colorless transparency of the polyimide.

The substance that can release a metal ion is preferably a substance (M) that can release at least one metal selected from groups 1 and 2 of the periodic table as a metal ion. Preferred examples of the substance (M) include metal oxides and metal salts that can release at least one metal selected from groups 1 and 2 of the periodic table as a metal ion.

Examples of the substance (M) that can release a metal ion include the following compounds.

Group 1
Na: sodium oxide and salts, such as sodium carbonate
K: potassium oxide and salts, such as potassium carbonate
Group 2
Be; beryllium oxide
Mg; magnesium oxide and salts, such as magnesium carbonate
Ca; calcium oxide and acid salts, such as calcium carbonate
Sr; salts, such as strontium carbonate
Ba; barium oxide and salts, such as barium carbonate.

Examples of the substance that can release a metal ion also include compounds containing a plurality of metallic elements of groups 1 and 2, for example, oxides, such as aluminum calcium oxide, and salts, such as alum [representative composition: $KAl_3(SO_4)_2(OH)_6$].

Among the substances that can release a metal ion, magnesium oxide, magnesium carbonate, calcium oxide, and calcium carbonate are more preferred.

The type and content of a substance that can release a metal ion contained in talc can be analyzed in the following manner.

Elements of talc are analyzed by X-ray fluorescence analysis. The thermal weight loss of talc and gas components evolved in heat treatment are analyzed by thermogravimetry-mass spectrometry (TG-MS). Heat-treated talc is dispersed in water, and free metal ions are identified by inductively coupled plasma (ICP) emission spectrometry. Thus, the type and content of a substance that can release a metal ion are determined.

If the substance that can release a metal ion is carbonate, the measurement of thermal weight loss and the detection of evolved carbon dioxide by TG-MS analysis are performed in firing of talc. Heat-treated talc is then dispersed in water, and free metal ions are analyzed by inductively coupled plasma (ICP) emission spectroscopy. Thus, the type and content of carbonate are determined.

The content of the substance that can release a metal ion contained in talc preferably ranges from 0.2% to 5.0% by mass in terms of metal, more preferably 1.0% to 3.0% by mass in terms of metal, of the total mass of talc. When the content of the substance that can release a metal ion is in the range described above, the tendency to improve the physical properties, particularly the glass transition temperature, can become more remarkable.

In the present invention, pulverized talc is not used directly but is heat-treated at a high temperature before use. When commercially available talc (for example, FFR (trade name) manufactured by Asada Milling Co., Ltd.) is heated from room temperature to approximately 900° C. in a thermobalance, the weight loss ranges from 2% to 3% at 650° C. or more. In the present invention, talc appropriately heat-treated at a temperature in the range of 650° C. to 800° C. is preferably used. Satisfactory weight loss behavior cannot be observed below 650° C., and structure molecules in crystals are decomposed and eliminated above 800° C. In both cases, desired heat-treated talc cannot be manufactured.

The heat-treatment temperature of the heat-treated talc more preferably ranges from 650° C. to 750° C., particularly preferably 670° C. to 730° C.

The heat treatment may be performed in any atmosphere, including in the air, in oxygen, in nitrogen, or in another inert gas, or under reduced pressure or vacuum, in general.

The heat-treatment time is appropriately determined in accordance with the temperature and generally ranges from one to 24 hours, preferably approximately one to five hours, more preferably approximately two to four hours.

Heat-treatment conditions (temperature and time) in the ranges described above can facilitate the conversion of a substance that can release a metal ion contained in talc into a substance having a higher affinity for a polyamic acid. If the substance that can release a metal ion is carbonate, the heat treatment converts the carbonate into an oxide having a higher affinity for a polyamic acid.

Such heat treatment allows the formation of a cross-linked structure through ionic interaction, for example, ionic bonding. This probably reduces the coefficient of linear expansion and increases the glass transition temperature of a polyimide without impairing the intrinsic heat resistance and colorless transparency of the polyimide.

In the manufacture of a polyimide composite film formed of a polyimide composite (2) according to the present invention, a polyimide precursor polyamic acid solution (S1), that is, a polyamic acid varnish (a polyimide precursor varnish) can be used. A polyamic acid (that is, a polyimide precursor) used herein has the following general formula (1).

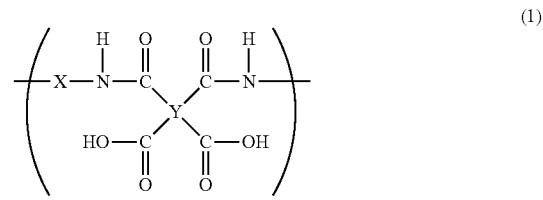

(wherein X denotes a divalent organic group, and Y denotes a tetravalent organic group)

A polyamic acid (that is, a polyimide precursor) used to produce a polyimide having the general formula (2B) has the following general formula (1B).

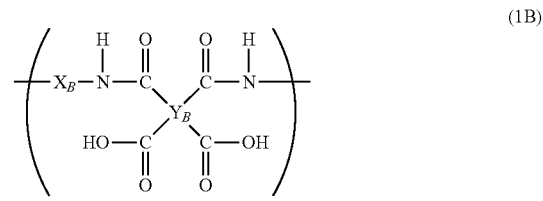

(In the formula (1B), $X_B$ denotes a divalent aromatic group containing 6 to 51 carbon atoms, and $Y_B$ denotes a tetravalent alicyclic group containing 4 to 12 carbon atoms.)

A polyamic acid (that is, a polyimide precursor) used to produce a polyimide having the general formula (2C) has the following general formula (1C).

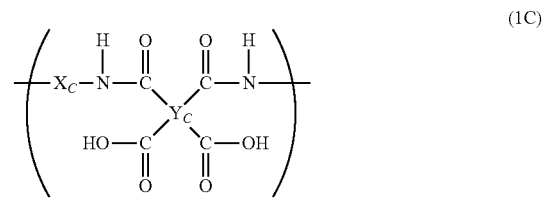

(In the formula (1C), $X_C$ denotes a divalent alicyclic group containing 4 to 15 carbon atoms, and $Y_C$ denotes a tetravalent alicyclic group containing 4 to 12 carbon atoms.)

A polyamic acid (that is, a polyimide precursor) used to produce a polyimide having the general formula (2D) has the following general formula (1D).

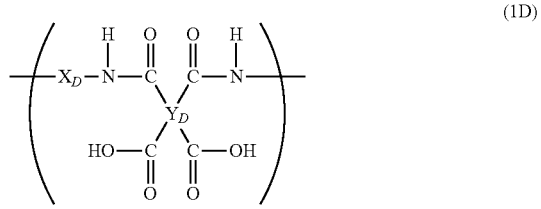

(1D)

(In the formula (1D), $X_D$ denotes a divalent aromatic group containing 6 to 51 carbon atoms, and $Y_D$ denotes a tetravalent aromatic group containing 6 to 27 carbon atoms.)

A polyamic acid (that is, a polyimide precursor) used to produce a polyimide having the general formula (2E) has the following general formula (1E).

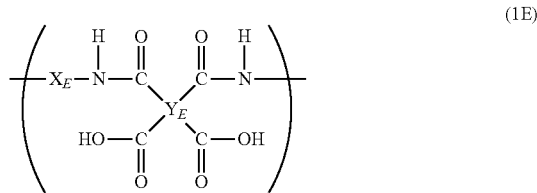

(1E)

(In the formula (1E), $X_E$ denotes a divalent alicyclic hydrocarbon group containing 4 to 15 carbon atoms, and $Y_E$ denotes a tetravalent aromatic hydrocarbon group containing 6 to 27 carbon atoms.)

A polyamic acid varnish may be synthesized by any known method and is generally produced by the polymerization of the divalent diamine compound and the tetravalent tetracarboxylic acid dianhydride in an aprotic polar solvent.

In the polymerization reaction, the raw materials may be added to a polymerization reaction system by any method. Examples of the method include a) a method in which a diamine compound, a tetracarboxylic acid dianhydride, and a solvent are added simultaneously, b) a method in which a diamine compound and a solvent are mixed before the addition of a tetracarboxylic acid dianhydride, c) a method in which a tetracarboxylic acid dianhydride and a solvent are mixed before the addition of a diamine compound, and d) a method in which a mixture of a tetracarboxylic acid dianhydride and a solvent and a mixture of a diamine compound and the solvent are mixed.

Any of these methods can be used.

While a polyimide and a polyimide precursor (that is, a polyamic acid) according to the present invention have the general formulae (2) and (1), their molecular ends may be blocked or not. In the case that the molecular ends are blocked, as already known, it is desirable that the molecular ends be blocked with a group that has no reactivity to amines or dicarboxylic acid anhydrides. More specifically, it is desirable that molecular ends of a polymer having the constitutional repeating unit having the general formula (1) or (2) be blocked with a dicarboxylic acid anhydride or monoamine.

In the production of a polyamic acid or polyimide, the weight ratio of the tetracarboxylic acid dianhydride to the diamine compound is generally adjusted to control the molecular weight of the resulting polyamic acid or polyimide. In the present invention, the molar ratio of all the tetracarboxylic acid dianhydrides to all the diamine compounds preferably ranges from 0.9 to 1.1.

Molecular ends of a polyamic acid or polyimide are blocked in the following two ways. When the amount of diamine compound is excessive and molecular ends are blocked with a dicarboxylic acid anhydride, preferably, a tetracarboxylic acid dianhydride is 0.9 mol or more but less than 1.0 mol, and the dicarboxylic acid anhydride is in the range of 0.001 to 1.0 mol, on the basis of 1 mol of the diamine compound. When the amount of acid dianhydride is excessive and molecular ends are blocked with a monoamine, preferably, a diamine compound is 0.9 mol or more but less than 1.0 mol, and the monoamine is in the range of 0.001 to 1.0 mol, on the basis of 1 mol of the tetracarboxylic acid dianhydride.

When the molar ratio of all the acid dianhydrides to all the diamine compounds ranges from 0.9 to 1.1, the resulting polyamic acid or polyimide has the following molecular weight. For a polyamic acid, the logarithmic viscosity generally ranges from 0.1 to 3.0 g/dl, as measured in an N-methyl-2-pyrrolidone solvent at a concentration of 0.5 dl/g at 35° C. For a polyimide, the logarithmic viscosity generally ranges from 0.1 to 3.0 dl/g, as measured in a mixed solvent of p-chlorophenol/phenol=9/1 (weight) at a concentration of 0.5 g/dl at 35° C.

In the case that the polyimide contained in a polyimide composite (2) according to the present invention is a copolymer, at least two constitutional repeating units of the copolymer may be ordered or regulated, or not. The type of the copolymer may be random, alternating, or block. When the diamine and the tetracarboxylic acid dianhydride contain three or more raw materials in total, therefore, these raw materials may be added at a time or in portions in any order.

While a solvent used in the production of a polyimide composite (2) according to the present invention is an aprotic polar solvent, an aprotic amide solvent is particularly effective. Examples of the amide solvent include N,N-dimethylformamide, N,N-dimethylacetamide, N,N-diethylacetamide, N-methyl-2-pyrrolidone, 1,3-dimethyl-2-imidazolidinone, N-methylcaprolactam, and hexamethylphosphorotriamide. Among these amide solvents, N,N-dimethylformamide, N,N-dimethylacetamide, N,N-diethylacetamide, N-methyl-2-pyrrolidone, and 1,3-dimethyl-2-imidazolidinone are preferred, and N,N-dimethylacetamide is more preferred.

In order to produce a polyimide composite (2), for example, a film, according to the present invention, a colorless and transparent polyimide precursor varnish (a composite varnish) containing a mixture of the polyimide precursor varnish and the substance (m), for example, heat-treated talc, that is, a polyamic acid solution (S2) must be produced in the previous step. For example, the composite varnish is produced by mixing the polyimide precursor varnish containing 100 to 1000 parts by weight of the aprotic polar solvent per 100 parts by weight of the polyimide precursor with 5 to 50 parts by weight of the substance (m), for example, heat-treated talc, per 100 parts by weight of the polyimide precursor. Less than 5 parts by weight of the substance (m) has small effects of reducing the coefficient of linear expansion and improving the glass transition temperature. More than 50 parts by weight of the substance (m) results in a decrease in the mechanical strength of the finally produced polyimide composite film, causing practical difficulties. The mixing method may be any known method and can generally involve the use of an apparatus, such as a mixer or a blender. The mixing conditions are appropriately determined in accordance with the dispersion state of talc. It is desirable that the mixing be performed at a temperature in the range of approximately 0° C. to 50° C. to prevent imidization of a polyimide precursor.

The mixing is desirably performed at a temperature in the range of 0° C. to 50° C., more desirably 10° C. to 40° C.

The mixing can preferably be performed by agitation for 30 minutes to 24 hours, more preferably 1 to 20 hours.

Preferably, the agitation in the production of a precursor varnish is performed sufficiently. For agitation with an impeller, agitation is generally performed at 5 to 400 rpm, preferably at 10 to 100 rpm.

With a planetary mixer, a precursor varnish can be produced by the agitation for 1 to 5 minutes at a revolution in the range of 1000 to 2500 rpm and a rotation in the range of 200 to 1000 rpm.

The varnish may be produced in any atmosphere, for example, in the air or in an inert atmosphere, such as nitrogen.

After an additive agent, filler, and/or the like is added to the resulting varnish, that is, polyamic acid solution (S2) without compromising the advantages of the present invention, a polyimide composite (PIC) described below may be produced. The additive agent may be the additive agent used for the polyimide composite (1) described above.

A polyimide composite (2) according to the present invention can be produced by heating the polyimide precursor varnish, that is, the polyamic acid solution (S2) for imidization. The heating is generally performed at a temperature in the range of 150° C. to 300° C. for 30 minutes to 4 hours. The imidization may be performed using an imidizing agent, such as acetic anhydride.

In the present invention, polyamic acids having the constitutional units expressed by the general formulae (1B), (1C), and (1E) can be used to manufacture a film of a colorless and transparent polyimide composite (2). The polyimide composite film thus manufactured has a glass transition temperature of 200° C. or more, a total light transmittance of 80% or more, and a coefficient of linear expansion below 50 ppm/K, preferably below 30 ppm/K, at a temperature in the range of 100° C. to 200° C. A colorless and transparent polyimide composite (2) is characterized by the presence of the heat-treated talc and has a much higher glass transition temperature and a much lower coefficient of linear expansion than talc-free polyimide films. Furthermore, a colorless and transparent polyimide composite (2) has a higher glass transition temperature and 1% to 20% lower coefficient of linear expansion than films containing non-heat-treated talc.

The colorless and transparent polyimide composite, for example, film, can be widely applied to members that require high heat resistance, colorless transparency, and a low coefficient of linear expansion. Examples of possible applications and members include display material members, such as displays and flexible displays, transparent rigid and flexible circuit boards, protective films for solar cells, and coating materials of wires. In these cases, a colorless and transparent polyimide composite having a glass transition temperature below 200° C. cannot be resistant to heat treatment during processing, and a colorless and transparent polyimide composite having a total light transmittance below 80% cannot basically be used in members that require "colorless and transparent". Furthermore, a colorless and transparent polyimide composite having a coefficient of linear expansion of 30 ppm/K or more cannot be applied to members that require small linear expansion, such as circuit boards.

In the present invention, a polyamic acid having the constitutional unit expressed by the general formula (1D) can be used to manufacture an aromatic polyimide composite film. The polyimide composite film thus manufactured has a glass transition temperature of 200° C. or more and a coefficient of linear expansion below 50 ppm/K, preferably below 30 ppm/K, at a temperature in the range of 100° C. to 200° C. This aromatic polyimide composite is characterized by the presence of the heat-treated talc and has a much higher glass transition temperature and a much lower coefficient of linear expansion than talc-free polyimide films. Furthermore, the aromatic polyimide composite has a higher glass transition temperature and 1% to 20% smaller coefficient of linear expansion than composites containing non-heat-treated talc.

The aromatic polyimide composite, for example, film, can be widely applied to members that require high heat resistance and a low coefficient of linear expansion. Examples of possible applications and members include display material members, such as displays and flexible displays, heat-resistant rigid and flexible circuit boards, protective films for solar cells, and coating materials of wires. An aromatic polyimide composite having a glass transition temperature below 200° C. cannot be resistant to heat treatment during processing. An aromatic polyimide composite having a coefficient of linear expansion of 30 ppm/K or more cannot be applied to members that require small linear expansion, such as circuit boards.

A film of a colorless and transparent polyimide composite (2) according to the present invention may be manufactured to have any thickness in the range of several micrometers to several hundred micrometers. A composite film can be manufacture by coating at a thickness in the range of 10 to 1000 μm and heating at a temperature in the range of 150° C. to 300° C. in the air or in an inert atmosphere, such as nitrogen, for 30 minutes to 4 hours. The detailed conditions can be appropriately determined in accordance with the concentration of varnish to be used, the amount of heat-treated talc to be added, a solvent to be used, or a desired film thickness.

EXAMPLES

The present invention will be further described in the following examples. However, the present invention is not limited to these examples.

Examples of Substance (M)

Various test methods common to examples will be described below.

1) Inherent Logarithmic Viscosity of Polyamic acid

A polyamic acid was dissolved in N,N-dimethylacetamide (DMAc) such that the solid content was 0.5 g/dl. The resulting polyamic acid solution was subjected to measurements at 35° C.

2) Analysis of Metallic Elements in Polyimide Composite (Film)

After dry ashing of a sample (film), the sample was dissolved in nitric acid. A certain volume of the sample solution was used as a test solution. Quantitative determination was performed by high-frequency inductively coupled plasma emission spectrometry (ICPS-8100 manufactured by Shimadzu Co.).

3) Glass Transition Temperature (Tg) and Coefficient of Thermal Linear Expansion Measurements were performed with TMA-50 manufactured by Shimadzu Co. in a nitrogen stream at a heating rate of 10° C./minute at a load of 3 g. The coefficient of thermal linear expansion was measured at a temperature in the range of 100° C. to 200° C.

4) Solution Viscosity (E-type)

N,N-dimethylacetamide (DMAc) was added to polyamic acid solution to be measured such that the polyamic acid was 15% by weight, thus preparing a test solution. Measurements were performed with an E-type mechanical viscometer manufactured by Tokyo Keiki Inc. at 25° C.

Reagents used in Examples 1A to 18A and Reference Examples 1A to 5A were as follows:

Potassium hydroxide (granular, 85%, manufactured by Wako Pure Chemical Industries, Ltd.)

Magnesium hydroxide (95%, manufactured by Kanto Chemical Co., Inc.)

Calcium hydroxide (96%, manufactured by Wako Pure Chemical Industries, Ltd.)

Calcium oxide (block, manufactured by Wako Pure Chemical Industries, Ltd.)

Strontium hydroxide (95%, manufactured by Sigma-Aldrich Corp.)

Barium hydroxide (>95%, manufactured by Strem Chemicals Inc.)

Calcium acetate (monohydrate) (>99%, manufactured by Wako Pure Chemical Industries, Ltd.)

Calcium formate (98%, manufactured by Alfa Aesar)

Tricalcium phosphate (manufactured by MP Biomedicals LLC.)

Calcium acetylacetonate (hydrate) (manufactured by Strem Chemicals Inc.)

Nickel hydroxide (II) (95%, manufactured by Wako Pure Chemical Industries, Ltd.)

Copper (II) hydroxide (90%, manufactured by Wako Pure Chemical Industries, Ltd.)

Aluminum hydroxide (Reagent grade, 50%-57%, manufactured by Sigma-Aldrich Corp.)

Aluminum oxide (97%, 80 nm, manufactured by Wako Pure Chemical Industries, Ltd.)

Abbreviations for raw materials and solvents common to Examples and Comparative Examples and their tables are as follows:

a) Diamines

NBDA; norbornanediamine (compound 1A)

H-XDA; 1,4-bis(aminomethyl)cyclohexane (compound 2A)

pXDA; p-xylylenediamine (compound 3A)

APB; 1,3-bis(3-aminophenoxy)benzene (compound 4A)

mBP; 4,4'-bis(3-aminophenoxy)biphenyl (compound 5A)

b) Aromatic Tetracarboxylic Acid Dianhydrides

PMDA; pyromellitic acid dianhydride (compound 6A)

BPDA; 3,3',4,4'-biphenyltetracarboxylic acid dianhydride (compound 7A)

H-PMDA; 1,2,4,5-cyclohexanetetracarboxylic acid dianhydride (compound 8A)

BTDA; 3,3',4,4'-benzophenonetetracarboxylic acid dianhydride (compound 9A)

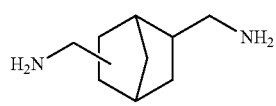

Compound 1A

Compound 2A

Compound 3A

Compound 4A

Compound 5A

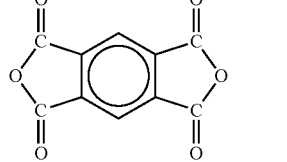

Compound 6A

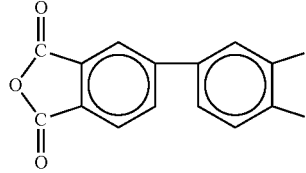

Compound 7A

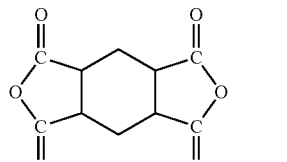

Compound 8A

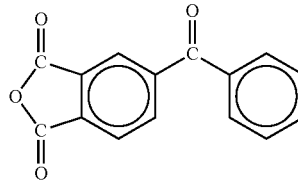

Compound 9A

Synthesis Example 1A

Polymerization of Polyamic Acid and Preparation of Polyimide 153 g (0.700 mol) of pyromellitic acid dianhydride (PMDA) and 420 g of an organic solvent N,N-dimethylacetamide (DMAc) were charged into a 1-L five-neck separable flask equipped with a thermometer, a stirrer, a nitrogen inlet, and a dropping funnel, and were agitated in an ice-water bath at 0° C. to prepare slurry liquid. 108 g (0.700 mol) of norbornanediamine (NBDA) and 188 g of N,N-dimethylacetamide (DMAc) in the dropping funnel were slowly added dropwise over two hours. After the dropwise addition, agitation at room temperature for another 16 hours yielded a solution (a polyimide precursor polymer varnish) containing a polyamic acid (a polyimide precursor polymer).

The resulting polyamic acid had an inherent logarithmic viscosity of 0.58 dL/g (35° C., 0.5 g/dL). This polyamic acid solution was diluted with DMAc to prepare a 15% by weight solution of polyamic acid. The viscosity of this solution was measured with an E-type viscometer. The solution viscosity was 156 mPa·s.

The resulting polyamic acid solution was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide film having a thickness of 36 μm.

This polyimide film had a glass transition temperature (Tg) of 290° C. and a coefficient of thermal linear expansion of 50 ppm/K at a temperature in the range of 100° C. to 200° C. Table 1-A shows the results.

Synthesis Example 2A

A polyamic acid solution and a colorless and transparent polyimide film were prepared in the same manner as Synthesis Example 1A except that norbornanediamine (NBDA) and pyromellitic acid dianhydride (PMDA) were replaced by 71.1 g (0.500 mol) of 1,4-bis(aminomethyl)cyclohexane (H-XDA) and 147 g (0.500 mol) of 3,3',4,4'-biphenyltetracarboxylic acid dianhydride (BPDA), and their physical properties were measured. Table 1-A shows the results.

Synthesis Example 3A

A polyamic acid solution and a colorless and transparent polyimide film were prepared in the same manner as Synthesis Example 1A except that norbornanediamine (NBDA) and pyromellitic acid dianhydride (PMDA) were replaced by 81.7 g (0.600 mol) of p-xylylenediamine (pXDA) and 177 g (0.600 mol) of 3,3',4,4'-biphenyltetracarboxylic acid dianhydride (BPDA), and their physical properties were measured. Table 1-A shows the results.

Synthesis Example 4A

A polyamic acid solution and a colorless and transparent polyimide film were prepared in the same manner as Synthesis Example 1A except that pyromellitic acid dianhydride (PMDA) was replaced by 157 g (0.700 mol) of 1,2,4,5-cyclohexanetetracarboxylic acid dianhydride (H-PMDA), and their physical properties were measured. Table 1-A shows the results.

Synthesis Example 5A

A polyamic acid solution and a colorless and transparent polyimide film were prepared in the same manner as Synthesis Example 1A except that norbornanediamine (NBDA) and pyromellitic acid dianhydride (PMDA) were replaced by 131 g (0.450 mol) of 1,3-bis(3-aminophenoxy)benzene (APB) and 145 g (0.450 mol) of 3,3',4,4'-benzophenonetetracarboxylic acid dianhydride (BTDA), and their physical properties were measured. Table 1-A shows the results.

Synthesis Example 6A

A polyamic acid solution and a colorless and transparent polyimide film were prepared in the same manner as Synthesis Example 1A except that norbornanediamine (NBDA) and pyromellitic acid dianhydride (PMDA) were replaced by 166 g (0.450 mol) of 4,4'-bis(3-aminophenoxy)biphenyl (mBP) and 98.1 g (0.450 mol) of pyromellitic acid dianhydride (PMDA), and their physical properties were measured. Table 1-A shows the results.

Synthesis Example 7A

A polyamic acid solution and a colorless and transparent polyimide film were prepared in the same manner as Synthesis Example 1A except that the tetracarboxylic acid dianhydride was replaced by 76.3 g (0.350 mol) of pyromellitic acid dianhydride (PMDA) and 103 g (0.350 mol) of 3,3',4,4'-biphenyltetracarboxylic acid dianhydride (BPDA), and their physical properties were measured. Table 1-A shows the results.

Synthesis Example 8A 100 g of the polyamic acid solution produced in Synthesis Example 7A was poured into a 300-mL five-neck separable flask equipped with a thermometer, a stirrer, a nitrogen inlet, a condenser tube, and a Dean and Stark apparatus. After the addition of 25 mL of toluene, the polyamic acid solution was allowed to react in an oil bath at 165° C. for 4 hours. An azeotropic solvent toluene was evaporated with the Dean and Stark apparatus to prepare a solution containing thermally imidized polyimide. This solution was used to form a film under the conditions described in Synthesis Example 1A. Table 1-A shows the measurements of the physical properties of the polyimide solution and the colorless and transparent polyimide.

Example 1A 1.4 equivalents (0.0418 g) of calcium hydroxide per 100 equivalents of a constitutional repeating unit of a polyamic acid was added to the polyamic acid solution (50.0 g) prepared in Synthesis Example 1A. The polyamic acid solution was agitated with an impeller in a nitrogen atmosphere at an agitation speed of 50 rpm at 20° C. for 20 hours to prepare a mixture containing a polyamic acid composite that contained calcium as a metallic element.

A calcium-containing polyamic acid solution (S2) prepared by the filtration of the mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite (film) having a thickness of 26 μm. Table 2-A shows the physical properties of the calcium-containing polyamic acid solution (S2) and the polyimide composite (film). The metal content (Ca content) of the composite film was one equivalent per 100 equivalents of the polyimide constitutional repeating unit, as measured by high-frequency inductively coupled plasma emission spectrometry.

Example 2A

A calcium-containing polyamic acid solution (S2) and a colorless and transparent polyimide composite (film) were prepared in the same manner as Example 1A except that the amount of calcium hydroxide added per 100 equivalents of a constitutional repeating unit of the polyamic acid was altered from 1.4 equivalents (0.0418 g) to 8.0 equivalents (0.239 g). Table 2-A shows the physical properties of the calcium-containing polyamic acid solution (S2) and the colorless and transparent polyimide composite (film). The metal content (Ca content) of the composite film was six equivalents per 100 equivalents of the polyimide constitutional repeating unit, as measured by high-frequency inductively coupled plasma emission spectrometry.

Example 3A

A calcium-containing polyamic acid solution (S2) and a colorless and transparent polyimide composite (film) were prepared in the same manner as Example 1A except that the amount of calcium hydroxide added per 100 equivalents of a constitutional repeating unit of the polyamic acid was altered from 1.4 equivalents (0.0418 g) to 14 equivalents (0.418 g). Table 2-A shows the physical properties of the calcium-containing polyamic acid solution (S2) and the colorless and transparent polyimide composite (film). The metal content (Ca content) of the composite film was 12 equivalents per 100 equivalents of the polyimide constitutional repeating unit, as measured by high-frequency inductively coupled plasma emission spectrometry.

Example 4A

A calcium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.316 g) of calcium oxide. Table 2-A shows the physical properties of the calcium-containing polyamic acid solution (S2) and the colorless and transparent polyimide composite (film). The metal content (Ca content) of the composite film was four equivalents per 100 equivalents of the polyimide constitutional repeating unit, as measured by high-frequency inductively coupled plasma emission spectrometry.

Example 5A

A potassium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.316 g) of potassium hydroxide. Table 2-A shows the physical properties of the potassium-containing polyamic acid solution (S2) and the colorless and transparent polyimide composite (film). The metal content (K content) of the composite film ranged from 1 to 30 equivalents per 100 equivalents of the polyimide constitutional repeating unit.

Example 6A

A magnesium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.329 g) of magnesium hydroxide. Table 2-A shows the physical properties of the magnesium-containing polyamic acid solution (S2) and the colorless and transparent polyimide composite (film). The metal content (Mg content) of the composite film was eight equivalents per 100 equivalents of the polyimide constitutional repeating unit, as measured by high-frequency inductively coupled plasma emission spectrometry.

Example 7A

A strontium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.686 g) of strontium hydroxide. Table 2-A shows the physical properties of the strontium-containing polyamic acid solution (S2) and the colorless and transparent polyimide composite (film). The metal content (Sr content) of the composite film was eight equivalents per 100 equivalents of the polyimide constitutional repeating unit, as measured by high-frequency inductively coupled plasma emission spectrometry.

Example 8A

A barium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.966 g) of barium hydroxide. Table 2-A shows the physical properties of the barium-containing polyamic acid solution (S2) and the colorless and transparent polyimide composite (film). The metal content (Ba content) of the composite film was five equivalents per 100 equivalents of the polyimide constitutional repeating unit, as measured by high-frequency inductively coupled plasma emission spectrometry.

Example 9A

A calcium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.994 g) of calcium acetate (monohydrate). Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 10A

A calcium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.734 g) of calcium formate. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 11A

A calcium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (2.83 g) of tricalcium phosphate. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 12A

A calcium-containing polyamic acid solution (S2) and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (1.34 g) of calcium acetylacetonate. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 13A

A calcium-containing polyamic acid solution (S2) and a colorless and transparent polyimide composite (film) were prepared in the same manner as Example 3A except that the polyamic acid solution (50.0 g) prepared in Synthesis Example 1A was replaced by the polyamic acid solution (50.0 g) prepared in Synthesis Example 2A and that 14 equivalents (0.418 g) of calcium hydroxide per 100 equivalents of a constitutional repeating unit of the polyamic acid was replaced by 14 equivalents (0.309 g) of calcium hydroxide. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 14A

A calcium-containing polyamic acid solution (S2) and a colorless and transparent polyimide composite (film) were prepared in the same manner as Example 3A except that the polyamic acid solution (50.0 g) prepared in Synthesis Example 1A was replaced by the polyamic acid solution (50.0 g) prepared in Synthesis Example 3A and that 14 equivalents (0.418 g) of calcium hydroxide per 100 equivalents of a constitutional repeating unit of the polyamic acid was replaced by 14 equivalents (0.361 g) of calcium hydroxide. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 15A

A calcium-containing polyamic acid solution (S2) and a colorless and transparent polyimide composite (film) were prepared in the same manner as Example 3A except that the polyamic acid solution (50.0 g) prepared in Synthesis Example 1A was replaced by the polyamic acid solution (50.0 g) prepared in Synthesis Example 4A and that 14 equivalents (0.418 g) of calcium hydroxide per 100 equivalents of a constitutional repeating unit of the polyamic acid was replaced by 14 equivalents (0.411 g) of calcium hydroxide. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 16A

A calcium-containing polyamic acid solution (S2) and colorless and transparent polyimide composite (film) were prepared in the same manner as Example 3A except that the polyamic acid solution (50.0 g) prepared in Synthesis Example 1A was replaced by the polyamic acid solution (50.0 g) prepared in Synthesis Example 5A and that 14 equivalents (0.418 g) of calcium hydroxide per 100 equivalents of a constitutional repeating unit of the polyamic acid was replaced by 14 equivalents (0.262 g) of calcium hydroxide. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 17A

A calcium-containing polyamic acid solution (S2) and a colorless and transparent polyimide composite (film) were prepared in the same manner as Example 3A except that the polyamic acid solution (50.0 g) prepared in Synthesis Example 1A was replaced by the polyamic acid solution (50.0 g) prepared in Synthesis Example 6A and that 14 equivalents (0.418 g) of calcium hydroxide per 100 equivalents of a constitutional repeating unit of the polyamic acid was replaced by 14 equivalents (0.265 g) of calcium hydroxide. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Example 18A

A calcium-containing polyamic acid solution (S2) and a colorless and transparent polyimide composite (film) were prepared in the same manner as Example 3A except that the polyamic acid solution (50.0 g) prepared in Synthesis Example 1A was replaced by the polyamic acid solution (50.0 g) prepared in Synthesis Example 7A and that 14 equivalents (0.418 g) of calcium hydroxide per 100 equivalents of a constitutional repeating unit of the polyamic acid was replaced by 14 equivalents (0.291 g) of calcium hydroxide. Table 2-A shows the physical properties of the calcium-containing polyamic acid solution (S2) and the colorless and transparent polyimide composite (film). The metal content (Ca content) of the composite film ranged from 1 to 30 equivalents per 100 equivalents of the polyimide constitutional repeating unit.

Reference Example 1A

A polyamic acid solution and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.523 g) of nickel (II) hydroxide. Table 3-A shows the physical properties of the polyamic acid solution and the colorless and transparent polyimide composite (film).

Reference Example 2A

A polyamic acid solution and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.550 g) of copper (II) hydroxide. Table 3-A shows the physical properties of the polyamic acid solution and the colorless and transparent polyimide composite (film).

Reference Example 3A

A polyamic acid solution and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 14 equivalents (0.440 g) of aluminum hydroxide. Table 3-A shows the physical properties of the polyamic acid solution and the colorless and transparent polyimide composite (film).

Reference Example 4A

A polyamic acid solution and a colorless and transparent polyimide composite (film) were prepared in the same manner as Example 3A except that 14 equivalents (0.418 g) of calcium hydroxide per 100 equivalents of a constitutional repeating unit of the polyamic acid was replaced by 7 equivalents of aluminum oxide, that is, 14 equivalents (0.288 g) of aluminum element. Table 3-A shows the physical properties of the polyamic acid solution and the colorless and transparent polyimide composite (film).

Reference Example 5A

A polyimide solution and a colorless and transparent polyimide composite (film) were prepared in the same manner as Example 3A except that the polyamic acid solution (50.0 g) prepared in Synthesis Example 1A was replaced by the polyimide solution (50.0 g) prepared in Synthesis Example 8A and that 14 equivalents (0.418 g) of calcium hydroxide per 100 equivalents of a constitutional repeating unit was replaced by 14 equivalents (0.319 g) of calcium hydroxide. Table 3-A shows the physical properties of the polyimide solution and the colorless and transparent polyimide composite (film).

TABLE 1-A

| | | Physical properties of polyamic acid solution | | Physical properties of polyimide film | | |
|---|---|---|---|---|---|---|
| Synthesis example | Composition (diamine compound/tetracarboxylic acid dianhydride) | Logarithmic viscosity (dL/g) | E-type solution viscosity[1] (mPa·s) | Film thickness (μm) | Glass transition temperature (° C.) | Thermal linear expansion coefficient (ppm/K) |
| 1A | NBDA/PMDA | 0.58 | 156 | 36 | 290 | 50 |
| 2A | H-XDA/BPDA | 0.72 | 866 | 26 | 251 | 46 |
| 3A | pXDA/BPDA | 0.41 | 161 | 25 | 261 | 43 |
| 4A | NBDA/H-PMDA | 0.32 | 212 | 26 | 235 | 47 |
| 5A | APB/BTDA | 0.55 | 180 | 36 | 197 | 40 |
| 6A | mBP/PMDA | 0.78 | 407 | 24 | 275 | 41 |
| 7A | NBDA/(PMDA$_{50}$/BPDA$_{50}$) | 0.41 | 142 | 32 | 267 | 49 |
| 8A | NBDA/(PMDA$_{50}$/BPDA$_{50}$) | 0.71 | 650 | 26 | 270 | 48 |

Note 1:
Measured after a polyamic acid solution was diluted to 15% by weight in DMAc.
Note 2:
The subscripts in the compositions of Synthesis Examples 7A and 8A indicate the mole fractions.
Note 3:
Synthesis Example 8A is a polyimide varnish produced by thermal imidization of a polyamic acid varnish of Synthesis Example 7A.

TABLE 2-A

| Example | Polymer used | Metal additive agent | Amount added[1] (equivalent) | E-type solution viscosity[2] (mPa·s) | V2/V1 (%) | Film thickness (μm) | Glass transition temperature (° C.) | Thermal linear expansion coefficient (ppm/K) |
|---|---|---|---|---|---|---|---|---|
| 1A | Synthesis example 1A | Calcium hydroxide | 1.4 | 195 | 125 | 26 | 297 | 48 |
| 2A | Synthesis example 1A | Calcium hydroxide | 8.0 | 397 | 254 | 31 | 317 | 46 |
| 3A | Synthesis example 1A | Calcium hydroxide | 14 | 2710 | 1737 | 23 | 327 | 40 |
| 4A | Synthesis example 1A | Calcium oxide | 14 | 325 | 208 | 27 | 307 | 45 |
| 5A | Synthesis example 1A | Potassium hydroxide | 14 | 286 | 183 | 26 | 302 | 46 |
| 6A | Synthesis example 1A | Magnesium hydroxide | 14 | 3170 | 2032 | 28 | 316 | 38 |
| 7A | Synthesis example 1A | Strontium hydroxide | 14 | 1020 | 654 | 25 | 325 | 45 |
| 8A | Synthesis example 1A | Barium hydroxide | 14 | 298 | 191 | 26 | 310 | 46 |
| 9A | Synthesis example 1A | Calcium acetate | 14 | 313 | 201 | 31 | 319 | 41 |

TABLE 2-A-continued

| Example | Polymer used | Metal additive agent | Amount added[1] (equivalent) | E-type solution viscosity[2] (mPa·s) | V2/V1 (%) | Film thickness (μm) | Glass transition temperature (°C.) | Thermal linear expansion coefficient (ppm/K) |
|---|---|---|---|---|---|---|---|---|
| 10A | Synthesis example 1A | Calcium formate | 14 | 208 | 133 | 31 | 295 | 47 |
| 11A | Synthesis example 1A | Tricalcium phosphate | 14 | 189 | 121 | 41 | 296 | 41 |
| 12A | Synthesis example 1A | Calcium acetylacetonate | 14 | 214 | 137 | 29 | 322 | 36 |
| 13A | Synthesis example 2A | Calcium hydroxide | 14 | 7630 | 881 | 22 | 275 | 43 |
| 14A | Synthesis example 3A | Calcium hydroxide | 14 | 764 | 475 | 26 | 302 | 39 |
| 15A | Synthesis example 4A | Calcium hydroxide | 14 | 478 | 225 | 22 | 246 | 44 |
| 16A | Synthesis example 5A | Calcium hydroxide | 14 | 1384 | 769 | 29 | 203 | 45 |
| 17A | Synthesis example 6A | Calcium hydroxide | 14 | 1630 | 400 | 27 | 289 | 37 |
| 18A | Synthesis example 7A | Calcium hydroxide | 14 | 1250 | 880 | 22 | 298 | 46 |

Note 1:
The amount of metal additive indicates the equivalent of a metal atom per 100 equivalents of a polyamic acid constitutional repeating unit.
Note 2:
Measured after a polyamic acid solution was diluted to 15% by weight in DMAc.

TABLE 3-A

| Reference example | Polymer used | Metal additive agent | Amount added[1] (equivalent) | E-type solution viscosity[2] (mPa·s) | V2/V1 (%) | Film thickness (μm) | Glass transition temperature (°C.) | Thermal linear expansion coefficient (ppm/K) |
|---|---|---|---|---|---|---|---|---|
| 1A | Synthesis example 1A | Nickel (II) hydroxide | 14 | 163 | 104 | 28 | 290 | 49 |
| 2A | Synthesis example 1A | Copper (II) hydroxide | 14 | 159 | 102 | 32 | 292 | 48 |
| 3A | Synthesis example 1A | Aluminum hydroxide | 14 | 159 | 102 | 32 | 289 | 47 |
| 4A | Synthesis example 1A | Aluminum oxide | 14 | 157 | 100 | 27 | 291 | 47 |
| 5A | Synthesis example 8A | Calcium hydroxide | 14 | 662 | 102 | 21 | 270 | 48 |

Note 1:
The amount of metal additive agent indicates the equivalent of a metal atom per 100 equivalents of a polyamic acid constitutional repeating unit.
Note 2:
Measured after a polyamic acid solution was diluted to 15% by weight in DMAc.

Examples of Substance (m)

Various test methods common to examples will be described below.

1) Logarithmic Viscosity of Polyimide Precursor (Polyamic acid Solution);

A polyimide precursor was dissolved in N,N-dimethylacetamide such that the solid content of the polyimide precursor was 0.5 g/dl. The resulting polyimide precursor solution was cooled to 35° C. and was subjected to measurements.

2) Glass Transition Temperature (Tg) and Coefficient of Linear Expansion;

Measurements were performed with TMA-50 manufactured by Shimadzu Co. in a nitrogen stream at a heating rate of 10° C./minute at a load of 3 g. The coefficient of linear expansion was measured at a temperature in the range of 100° C. to 200° C.

3) Measurements of Ash Content;

The content of an inorganic substance derived from a flat structure silicate compound (talc having a flat structure) in a polyimide composite film was measured with TGA-50 manufactured by Shimadzu Co. in the air at a heating rate of 10° C./minute. The ash content was calculated from the amount of residue at 900° C.

4) E-type viscosity; measured with an E-type mechanical viscometer manufactured by Tokyo Keiki Inc. at 25° C.

5) Total light transmittance; measured with HZ-2 (a TM double beam system) manufactured by Suga Test Instruments Co., Ltd. at an opening size of Φ20 mm with a light source of D65.

6) Analytical Conditions for Trace Metal Components of Talc;

The measurement of the thermal weight loss of talc and the identification of gases evolved in the heat treatment of talc were performed by TG-MS analysis (thermogravimetry-mass spectrometry) with TG8120 manufactured by Rigaku Co. (He atmosphere) and 6890 and 5973 manufactured by Hewlett-Packard Co.

Subsequently, heat-treated talc was dispersed in water, and free metal ions were analyzed by inductively coupled plasma (ICP) emission spectrometry with VISTA-PRO manufactured by Seiko Instruments Inc. to identify the metal ions. The type and amount of a substance that releases a metal ion were determined from these measurements.

A tablet of talc powder was subjected to X-ray fluorescence analysis with LAB CENTER XRF-1700 manufactured by Shimadzu Co. in a vacuum and was analyzed by a fundamental parameter (FP) method.

Abbreviations for raw materials and solvents common to Examples 1B to 10B and Reference Examples 1B to 6B and their tables are as follows:

a) Aromatic Diamines

ODA; 4,4'-diaminodiphenyl ether [4,4'-oxydianiline] (compound 1B)

m-BP; 4,4'-bis(3-aminophenoxy)biphenyl (compound 2B)

APB; 1,3-bis(3-aminophenoxy)benzene (compound 3B)

b) Alicyclic Tetracarboxylic Acid Dianhydrides

H-PMDA; 1,2,4,5-cyclohexanetetracarboxylic acid dianhydride (compound 4B)

H-BPDA; 3,3',4,4'-dicyclohexyltetracarboxylic acid dianhydride (compound 5B)

DFMC; 1-methyl-3-ethylcyclohex-1-ene-3-(1,2),5,6-tetracarboxylic acid dianhydride (compound 6B)

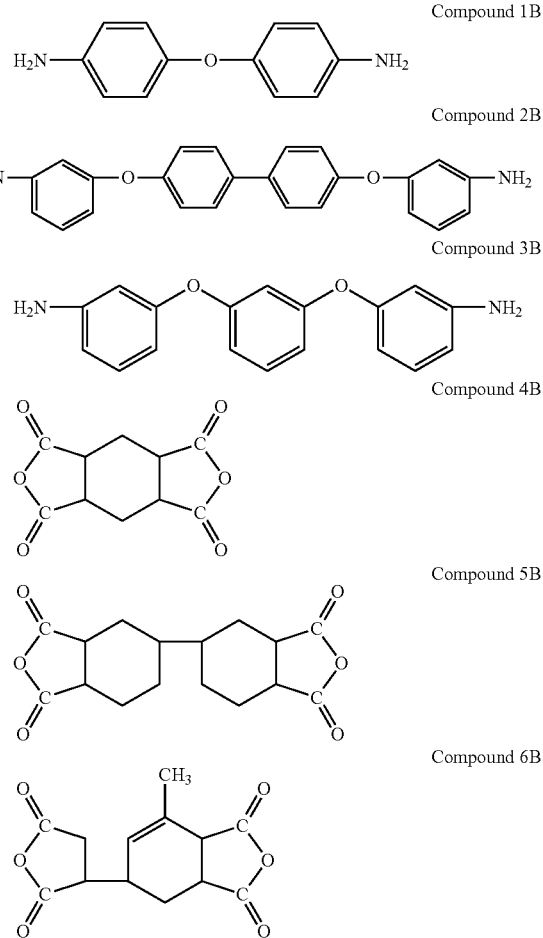

Synthesis Example 1B

Heat Treatment of Plate Silicate Compound

A powder of commercially available talc (product name: FFR, manufactured by Asada Milling Co., Ltd.: containing 6.58% by mass calcium carbonate [2.64% by mass in terms of Ca metal]) in a porcelain crucible was placed in a muffle furnace (product name: Automatic Muffle Furnace TMF5) available from Thomas Kagaku Co., Ltd., was heated in the airstream from 30° C. to 700° C. over one hour, and was held at 700° C. for three hours. The heat-treated talc remained a white powder. After cooling, the heat-treated talc was transferred into a sample bottle and was stored in a desiccator. The weight loss of the talc before heat treatment was approximately 2.9% at a temperature in the range of 580° C. to 680° C. FIG. 1 shows the weight loss behavior of the talc.

Synthesis Example 2B

Polymerization of Polyimide Precursor Polymer and Preparation of Polyimide Film 2.00 g (0.01 mol) of 4,4'-oxydianiline (ODA) and 9.89 g of an organic solvent N,N-dimethylacetamide were charged into a 1-L five-neck separable flask equipped with a thermometer, a stirrer, a nitrogen inlet, and a dropping funnel, and were agitated in an ice-water bath at 0° C. to prepare a solution. 2.24 g (0.01 mol) of 1,2,4,5-cyclohexanetetracarboxylic acid dianhydride (H-PMDA) was then charged into the flask in three portions over two hours. After the addition, agitation at room temperature for a whole day and night yielded a polymer solution (polyimide precursor polymer varnish) of a polyimide precursor polymer (polyamic acid). The polyimide precursor polymer had an inherent logarithmic viscosity of 0.37 dL/g (35° C., 0.5 g/dL) and an E-type viscosity of 7300 mPa·s.

The resulting polyimide precursor polymer varnish was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide film having a thickness of 65 μm.

This polyimide film had a glass transition temperature (Tg) of 330° C., a total light transmittance of 90%, and a coefficient of linear expansion of 58 ppm/K at a temperature in the range of 100° C. to 200° C. Table 1-B summarizes these results.

Synthesis Examples 3B and 4B

Polyamic acids (polyimide precursor polymer varnishes) and colorless and transparent polyimide films were prepared in the same manner as Synthesis Example 2B except that 2.00 g (0.01 mol) of 4,4'-oxydianiline was appropriately replaced by 0.01 mol of diamines shown in Table 1-B. Table 1-B also shows the physical properties of the polyamic acids and the polyimide films.

Synthesis Examples 5B and 6B

Polyamic acids (polyimide precursor polymer varnishes) and colorless and transparent polyimide films were prepared in the same manner as Synthesis Example 2B except that 2.24 g (0.01 mol) of 1,2,4,5-cyclohexanetetracarboxylic acid dianhydride (H-PMDA) was appropriately replaced by 0.01 mol of acid dianhydrides shown in Table 1-B. Table 1-B also shows the physical properties of the polyamic acids and the polyimide films.

Synthesis Examples 7B and 8B

Polyamic acids (polyimide precursor polymer varnishes) and colorless and transparent polyimide films were prepared in the same manner as Synthesis Example 2B except that 50% by mole of 2.00 g (0.01 mol) of 4,4'-oxydianiline was appropriately replaced by diamines shown in Table 1-B. Table 1-B also shows the physical properties of the polyamic acids and the polyimide films.

Synthesis Example 9B

A polyamic acid (polyimide precursor polymer varnish) and a colorless and transparent polyimide film were prepared in the same manner as Synthesis Example 2B except that 50% by mole of 2.24 g (0.010 mol) of 1,2,4,5-cyclohexanetetracarboxylic acid dianhydride (H-PMDA) was appropriately replaced by an acid dianhydride shown in Table 1-B. Table 1-B also shows the physical properties of the polyamic acid and the polyimide film.

Example 1B 45 parts by weight of the heat-treated talc prepared in Synthesis Example 1B was added to 100 parts by weight of the polyamic acid in the colorless and transparent polyimide precursor varnish prepared in Synthesis Example 2B and was agitated with a planetary mixer (or a kneading, mixing, and degassing apparatus) (manufactured by Keyence Corp., product name: Hybrid Mixer-500) for five minutes to prepare a dispersion liquid of fired talc (a two-component liquid mixture) (a composite varnish). The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 30 μm. This film had an ash content of 32%, a glass transition temperature of 342° C., a coefficient of linear expansion of 19 ppm/K at a temperature in the range of 100° C. to 200° C., and a total light transmittance of 87%. Table 2-B shows these results.

Reference Example 1B 45 parts by weight of non-heat-treated talc was added to 100 parts by weight of the polyamic acid in the colorless and transparent polyimide precursor varnish prepared in Synthesis Example 2B in the same manner as Example 1B and was agitated with a planetary mixer for five minutes to prepare a dispersion liquid of talc. The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 29 μm. This film had an ash content of 33%, a glass transition temperature of 331° C., a coefficient of linear expansion of 22 ppm/K at a temperature in the range of 100° C. to 200° C., and a total light transmittance of 87%. Table 2-B also shows these results.

Examples 2B and 3B

Colorless and transparent polyimide composite films were prepared in the same manner as Example 1B except that the amount of heat-treated talc added in Example 1B was appropriately altered. Table 2-B also shows the physical properties of the resulting composite films.

Reference Examples 2B and 3B

Colorless and transparent polyimide composite films were prepared in the same manner as Reference Example 1B except that the amount of non-heat-treated talc added in Reference Example 1B was appropriately altered. Table 2-B also shows the physical properties of the resulting composite films.

Examples 4B to 10B

Colorless and transparent polyimide composite films were prepared by changing the polymer used in Example 1B from Synthesis Example 2B to other appropriate polymers and using 30 parts by weight of heat-treated talc. Table 2-B also shows the physical properties of the resulting composite films.

Reference Examples 4B to 6B

Colorless and transparent polyimide composite films were prepared by changing the polymer used in Reference Example 1B from Synthesis Example 2B to other appropriate polymers and using 30 parts by weight of non-heat-treated talc. Table 2-B also shows the physical properties of the resulting composite films.

TABLE 1-B

| | | Physical properties of polyamic acid | | Physical properties of polyimide film | | | |
|---|---|---|---|---|---|---|---|
| Synthesis example | Composition (diamine/acid dianhydride) | Logarithmic viscosity (dl/g) | E-type viscosity (mPa · s) | Film thickness (μm) | Glass transition temperature (° C.) | Total light transmittance (%) | Linear expansion coefficient (ppm/K) |
| 2B | ODA/H-PMDA | 0.37 | 7300 | 65 | 330 | 90 | 58 |
| 3B | m-BP/H-PMDA | 0.33 | 6500 | 70 | 260 | 88 | 49 |
| 4B | APB/H-PMDA | 0.23 | 5600 | 70 | 211 | 88 | 49 |
| 5B | ODA/H-BPDA | 0.34 | 7100 | 55 | 282 | 89 | 56 |
| 6B | ODA/DFMC | 0.28 | 6000 | 63 | 235 | 88 | 65 |
| 7B | (ODA$_{50}$/m-BP$_{50}$)/H-PMDA | 0.35 | 7100 | 60 | 292 | 89 | 55 |
| 8B | (ODA$_{50}$/APB$_{50}$)/H-PMDA | 0.31 | 5800 | 62 | 276 | 88 | 58 |
| 9B | ODA/(H-PMDA$_{50}$/H-BPDA$_{50}$) | 0.36 | 7200 | 61 | 295 | 89 | 57 |

Note:
The subscripts in the compositions of Synthesis Examples 7B to 9B indicate the mole fractions.

TABLE 2-B

| Example | Polymer used | Amount of heat-treated talc (parts by weight) | Film thickness (μm) | Glass transition temperature (° C.) | Total light transmittance (%) | Linear expansion coefficient (ppm/K) | Ash content (%) |
|---|---|---|---|---|---|---|---|
| 1B | Synthesis example 2B | 45 | 30 | 342 | 87 | 19 | 32 |
| 2B | Synthesis example 2B | 30 | 28 | 338 | 88 | 25 | 24 |
| 3B | Synthesis example 2B | 15 | 31 | 334 | 89 | 34 | 14 |
| 4B | Synthesis example 3B | 30 | 29 | 269 | 87 | 26 | 25 |
| 5B | Synthesis example 4B | 30 | 32 | 220 | 87 | 25 | 26 |
| 6B | Synthesis example 5B | 30 | 30 | 291 | 87 | 27 | 24 |
| 7B | Synthesis example 6B | 30 | 31 | 242 | 86 | 29 | 24 |
| 8B | Synthesis example 7B | 30 | 30 | 300 | 88 | 24 | 26 |
| 9B | Synthesis example 8B | 30 | 31 | 283 | 87 | 26 | 25 |
| 10B | Synthesis example 9B | 30 | 29 | 303 | 87 | 27 | 25 |

| Reference example | Polymer used | Amount of non-heat-treated talc (parts by weight) | Film thickness (μm) | Glass transition temperature (° C.) | Total light transmittance (%) | Linear expansion coefficient (ppm/K) | Ash content (%) |
|---|---|---|---|---|---|---|---|
| 1B | Synthesis example 2B | 45 | 29 | 331 | 87 | 22 | 33 |
| 2B | Synthesis example 2B | 30 | 31 | 331 | 88 | 28 | 25 |
| 3B | Synthesis example 2B | 15 | 28 | 330 | 88 | 37 | 14 |
| 4B | Synthesis example 4B | 30 | 28 | 212 | 87 | 28 | 26 |
| 5B | Synthesis example 7B | 30 | 33 | 295 | 87 | 27 | 25 |
| 6B | Synthesis example 9B | 30 | 27 | 297 | 88 | 29 | 26 |

Note 1:
The amount of talc indicates the amount per 100 parts by weight of a polyamic acid.

Note 2:
The ash content was calculated from the amount of residue after firing at 900° C. in TGA with a polyimide composite film being 100%.

Abbreviations for raw materials and solvents common to Examples 1C to 9C and Reference Examples 1C to 5C and their tables are as follows:

a) Aromatic Diamines
  NBDA; norbornanediamine (compound 1C)
  H-XDA; 1,3-bis(aminomethyl)cyclohexane (compound 2C)
  H-MDA; 4,4'-methylenebis(cyclohexylamine) (compound 3C)

b) Alicyclic Tetracarboxylic Acid Dianhydrides
  H-PMDA; 1,2,4,5-cyclohexanetetracarboxylic acid dianhydride (compound 4C)
  H-BPDA; 3,3',4,4'-dicyclohexyltetracarboxylic acid dianhydride (compound 5C)
  DFMC; 1-methyl-3-ethylcyclohex-1-ene-3-(1,2),5,6-tetracarboxylic acid dianhydride (compound 6C)

Compound 1C

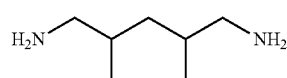

Compound 2C

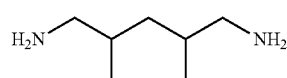

Compound 3C

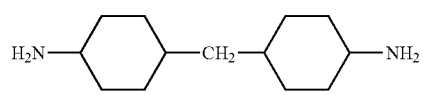

Compound 4C

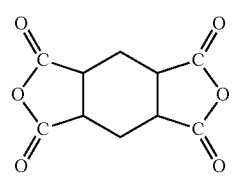

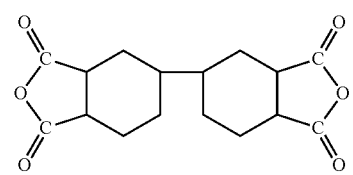

Compound 5C

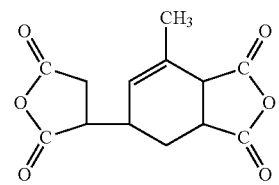

Compound 6C

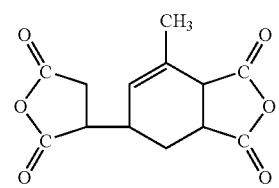

Compound 6C

Synthesis Example 1C

Heat Treatment of Plate Silicate Compound

A powder of commercially available talc (product name: FFR, manufactured by Asada Milling Co., Ltd.: containing 6.58% by mass calcium carbonate [2.64% by mass in terms of Ca metal]) in a porcelain crucible was placed in a muffle furnace (product name: Automatic Muffle Furnace TMF5) available from Thomas Kagaku Co., Ltd., was heated in the airstream from 30° C. to 700° C. over one hour, and was held at 700° C. for three hours. The heat-treated talc remained a white powder. After cooling, the heat-treated talc was transferred into a sample bottle and was stored in a desiccator.

The weight loss of the talc before heat treatment was approximately 2% at a temperature in the range of 580° C. to 680° C.

Synthesis Example 2C

Polymerization of Polyimide Precursor Polymer and Preparation of Polyimide Film 3.09 g (0.02 mol) of norbornanediamine (NBDA) and 9.89 g of an organic solvent N,N-dimethylacetamide were charged into a 1-L five-neck separable flask equipped with a thermometer, a stirrer, and a nitrogen inlet, and were agitated in an ice-water bath at 0° C. to prepare a solution. 4.48 g (0.02 mol) of 1,2,4,5-cyclohexanetetracarboxylic acid dianhydride (H-PMDA) was then charged into the flask in three portions over two hours. After the addition, agitation at room temperature for a whole day and night yielded a polymer solution (polyimide precursor polymer varnish) of a polyimide precursor polymer (polyamic acid). The polyimide precursor polymer had an inherent logarithmic viscosity of 0.25 dL/g (35° C., 0.5 g/dL) and an E-type viscosity of 4300 mPa·s.

The resulting polyimide precursor polymer varnish was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 70 μm.

This polyimide film had a glass transition temperature (Tg) of 249° C., a total light transmittance of 90%, and a coefficient of linear expansion of 50 ppm/K at a temperature in the range of 100° C. to 200° C. Table 1-C summarizes these results.

Synthesis Examples 3C to 8C

Polyamic acids (polyimide precursor polymer varnishes) and colorless and transparent polyimide films were prepared in the same manner as Synthesis Example 2C except that 3.09 g (0.02 mol) of norbornanediamine and 4.48 g (0.02 mol) of 1,2,4,5-cyclohexanetetracarboxylic acid dianhydride (H-PMDA) were appropriately replaced by 0.02 mol of diamines and 0.02 mol of acid dianhydrides shown in Table 1-C. Table 1-C also shows the physical properties of the polyamic acids and the polyimide films.

Example 1C 30 parts by weight of the heat-treated talc prepared in Synthesis Example 1C was added to 100 parts by weight of the polyamic acid in the colorless and transparent polyimide precursor varnish prepared in Synthesis Example 2C and was agitated with a planetary mixer (or a kneading, mixing, and degassing apparatus) (manufactured by Keyence Corp., product name: Hybrid Mixer-500) for five minutes to prepare a dispersion liquid of fired talc (a two-component liquid mixture) (a composite varnish). The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 33 μm. This film had an ash content of 24%, a glass transition temperature of 278° C., a coefficient of linear expansion of 26 ppm/K at a temperature in the range of 100° C. to 200° C., and a total light transmittance of 89%. Table 2-C shows these results.

Reference Example 1C 30 parts by weight of non-heat-treated talc was added to 100 parts by weight of the polyamic acid in the colorless and transparent polyimide precursor varnish prepared in Synthesis Example 2C in the same manner as Example 1C and was agitated with a planetary mixer for five minutes to prepare a dispersion liquid of talc. The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 30 μm. This film had an ash content of 25%, a glass transition temperature of 250° C., a coefficient of linear expansion of 28 ppm/K at a temperature in the range of 100° C. to 200° C., and a total light transmittance of 89%. Table 2-C also shows these results.

Examples 2C and 3C

Colorless and transparent polyimide composite films were prepared in the same manner as Example 1C except that the amount of heat-treated talc added in Example 1C was appropriately altered. Table 2-C also shows the physical properties of the resulting composite films.

Reference Examples 2C and 3C

Colorless and transparent polyimide composite films were prepared in the same manner as Reference Example 1C except that the amount of non-heat-treated talc added in Reference Example 1C was appropriately altered. Table 2-C also shows the physical properties of the resulting composite films.

Examples 4C to 9C

Colorless and transparent polyimide composite films were prepared by changing the polymer used in Example 1C from Synthesis Example 2C to other appropriate polymers and using 30 parts by weight of heat-treated talc. Table 2-C also shows the physical properties of the resulting composite films.

Reference Examples 4C and 5C

Colorless and transparent polyimide composite films were prepared by changing the polymer used in Reference Example 1C from Synthesis Example 2C to other appropriate polymers and using 30 parts by weight of non-heat-treated talc. Table 2-C also shows the physical properties of the resulting composite films.

TABLE 1-C

| Synthesis example | Composition (diamine/acid dianhydride) | Physical properties of polyamic acid | | Physical properties of polyimide film | | | |
|---|---|---|---|---|---|---|---|
| | | Logarithmic viscosity (dl/g) | E-type viscosity (mPa·s) | Film thickness (μm) | Glass transition temperature (°C.) | Total light transmittance (%) | Linear expansion coefficient (ppm/K) |
| 2C | NBDA/H-PMDA | 0.25 | 4300 | 70 | 249 | 90 | 50 |
| 3C | H-XDA/H-PMDA | 0.32 | 5100 | 65 | 211 | 89 | 58 |
| 4C | H-MDA/H-PMDA | 0.34 | 5700 | 73 | 266 | 91 | 62 |
| 5C | NBDA/H-BPDA | 0.28 | 4600 | 52 | 205 | 90 | 53 |
| 6C | NBDA/DFMC | 0.23 | 3200 | 43 | 215 | 88 | 68 |
| 7C | (NBDA$_{50}$/H-XDA$_{50}$)/H-PMDA | 0.30 | 4900 | 66 | 231 | 90 | 55 |
| 8C | NBDA/(H-PMDA$_{50}$/H-BPDA$_{50}$) | 0.33 | 5500 | 60 | 226 | 90 | 53 |

Note:
The subscripts in the compositions of Synthesis Examples 7C and 8C indicate the mole fractions.

TABLE 2-C

| Example | Polymer used | Amount of heat-treated talc (parts by weight) | Film thickness (μm) | Glass transition temperature (°C.) | Total light transmittance (%) | Linear expansion coefficient (ppm/K) | Ash content (%) |
|---|---|---|---|---|---|---|---|
| 1C | Synthesis example 2C | 30 | 33 | 278 | 89 | 26 | 24 |
| 2C | Synthesis example 2C | 15 | 29 | 259 | 89 | 33 | 15 |
| 3C | Synthesis example 2C | 45 | 31 | 289 | 88 | 20 | 33 |
| 4C | Synthesis example 3C | 30 | 30 | 240 | 88 | 30 | 25 |
| 5C | Synthesis example 4C | 30 | 30 | 291 | 89 | 34 | 25 |
| 6C | Synthesis example 5C | 30 | 29 | 235 | 88 | 29 | 26 |
| 7C | Synthesis example 6C | 30 | 32 | 242 | 87 | 36 | 24 |
| 8C | Synthesis example 7C | 30 | 33 | 260 | 89 | 29 | 25 |
| 9C | Synthesis example 8C | 30 | 30 | 258 | 88 | 27 | 24 |

| Reference example | Polymer used | Amount of non-heat-treated talc (parts by weight) | Film thickness (μm) | Glass transition temperature (°C.) | Total light transmittance (%) | Linear expansion coefficient (ppm/K) | Ash content (%) |
|---|---|---|---|---|---|---|---|
| 1C | Synthesis example 2C | 30 | 30 | 250 | 89 | 28 | 25 |
| 2C | Synthesis example 2C | 15 | 29 | 249 | 89 | 34 | 14 |
| 3C | Synthesis example 2C | 45 | 31 | 252 | 88 | 18 | 34 |
| 4C | Synthesis example 4C | 30 | 33 | 267 | 90 | 36 | 25 |
| 5C | Synthesis example 7C | 30 | 33 | 232 | 88 | 30 | 25 |

Note 3:
The amount of talc indicates the amount per 100 parts by weight of a polyamic acid.
Note 4:
The ash content was calculated from the amount of residue after firing at 900° C. in TGA with a polyimide composite film being 100%.

Abbreviations for raw materials and solvents common to Examples 1D to 7D and Reference Examples 1D to 6D and their tables are as follows:

a) Aromatic Diamines

ODA; 4,4'-diaminodiphenyl ether [4,4'-oxydianiline] (compound 1D)

m-BP; 4,4'-bis(3-aminophenoxy)biphenyl (compound 2D)

APB; 1,3-bis(3-aminophenoxy)benzene (compound 3D)

b) Aromatic Tetracarboxylic Acid Dianhydrides

PMDA; pyromellitic acid dianhydride (compound 4D)

BTDA; 3,3',4,4'-benzophenonetetracarboxylic acid dianhydride (compound 5D)

Compound 1D
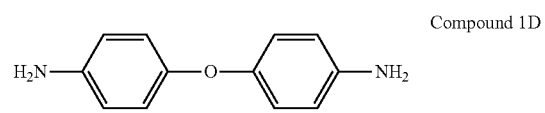

Compound 2D
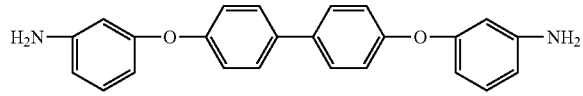

Compound 3D
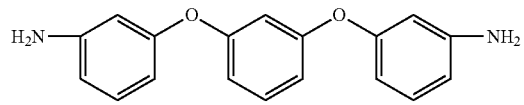

Compound 4D
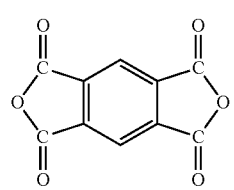

Compound 5D

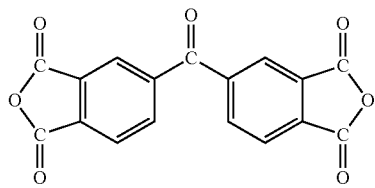

Synthesis Example 1D

Heat Treatment of Plate Silicate Compound

A powder of commercially available talc (product name: FFR, manufactured by Asada Milling Co., Ltd.: containing 6.58% by mass calcium carbonate [2.64% by mass in terms of Ca metal]) in a porcelain crucible was placed in a muffle furnace (product name: Automatic Muffle Furnace TMF5) available from Thomas Kagaku Co., Ltd., was heated in the airstream from 30° C. to 700° C. over one hour, and was held at 700° C. for three hours. The heat-treated talc remained a white powder. After cooling, the heat-treated talc was transferred into a sample bottle and was stored in a desiccator. The weight loss of the talc before heat treatment was approximately 2% at a temperature in the range of 580° C. to 680° C.

Synthesis Example 2D

Polymerization of Polyimide Precursor Polymer and Preparation of Polyimide Film 29.23 g (0.10 mol) of 1,3-bis(3-aminophenoxy)benzene (APB) and 182.92 g of an organic solvent N,N-dimethylacetamide were charged into a 1-L five-neck separable flask equipped with a thermometer, a stirrer, a nitrogen inlet, and a dropping funnel, and were agitated in an ice-water bath at 0° C. to prepare a solution. 31.74 g (0.0985 mol) of 3,3',4,4'-benzophenonetetracarboxylic acid dianhydride (BTDA) was then charged into the flask in three portions over two hours. After the addition, agitation at room temperature for a whole day and night yielded a polymer solution (polyimide precursor polymer varnish) of a polyimide precursor polymer (polyamic acid). The polyimide precursor polymer had an inherent logarithmic viscosity of 0.85 dL/g (35° C., 0.5 g/dL) and an E-type viscosity of 38500 mPa·s.

The resulting polyimide precursor polymer varnish was applied to a glass substrate with a doctor blade. The substrate was placed in an oven and was heated in a nitrogen stream from 50° C. to 250° C. over two hours. Subsequently, the substrate was held at 250° C. for two hours to form a self-supporting reddish brown polyimide film having a thickness of 55 μm.

This polyimide film had a glass transition temperature (Tg) of 195° C. and a coefficient of linear expansion of 45 ppm/K at a temperature in the range of 100° C. to 200° C. Table 1-D summarizes these results.

Synthesis Examples 3D to 5D

Polyamic acids (polyimide precursor polymer varnishes) and polyimide films were prepared in the same manner as Synthesis Example 2D except that 29.23 g (0.1 mol) of 1,3-bis(3-aminophenoxy)benzene and 31.74 g (0.0985 mol) of 3,3',4,4'-benzophenonetetracarboxylic acid dianhydride were appropriately replaced by 0.1 mol of diamines and 0.0985 mol of acid dianhydrides shown in Table 1-D. Table 1-D also shows the physical properties of the polyamic acids and the polyimide films.

Example 1D 30 parts by weight of the heat-treated talc prepared in Synthesis Example 1D was added to 100 parts by weight of the polyamic acid in the polyimide precursor varnish prepared in Synthesis Example 2D and was agitated with a planetary mixer (or a kneading, mixing, and degassing apparatus) (manufactured by Keyence Corp., product name: Hybrid Mixer-500) for five minutes to prepare a dispersion liquid of fired talc (a two-component liquid mixture) (a composite varnish). The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 28 μm. This film had an ash content of 24%, a glass transition temperature of 208° C., and a coefficient of linear expansion of 22 ppm/K at a temperature in the range of 100° C. to 200° C. Table 2-D shows these results.

Reference Example 1D 30 parts by weight of non-heat-treated talc was added to 100 parts by weight of the polyamic acid in the polyimide precursor varnish prepared in Synthesis Example 2D in the same manner as Example 1D and was agitated with a planetary mixer for five minutes to prepare a dispersion liquid of talc. The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting polyimide composite film having a thickness of 31 μm. This film had an ash content of 25%, a glass transition temperature of 196° C., and a coefficient of linear expansion of 21 ppm/K at a temperature in the range of 100° C. to 200° C. Table 2-D also shows these results.

Examples 2D and 3D

Polyimide composite films were prepared in the same manner as Example 1D except that the amount of heat-treated talc added in Example 1D was appropriately altered. Table 2-D also shows the physical properties of the resulting composite films.

Reference Examples 2D and 3D

Polyimide composite films were prepared in the same manner as Reference Example 1D except that the amount of non-heat-treated talc added in Reference Example 1D was appropriately altered. Table 2-D also shows the physical properties of the resulting composite films.

Examples 4D to 7D

Polyimide composite films were prepared by changing the polymer used in Example 1D from Synthesis Example 2D to other appropriate polymers and appropriately altering the amount of heat-treated talc added. Table 2-D also shows the physical properties of the resulting composite films.

Reference Examples 4D to 6D

Polyimide composite films were prepared by changing the polymer used in Reference Example 1D from Synthesis Example 2D to other appropriate polymers and appropriately altering the amount of non-heat-treated talc added. Table 2-D also shows the physical properties of the resulting composite films.

TABLE 1-D

| | | Physical properties of polyamic acid | | Physical properties of polyimide film | | |
|---|---|---|---|---|---|---|
| Synthesis example | Composition (diamine/acid dianhydride) | Logarithmic viscosity (dl/g) | E-type viscosity (mPa · s) | Film thickness (μm) | Glass transition temperature (° C.) | Linear expansion coefficient (ppm/K) |
| 2D | APB/BTDA | 0.85 | 38500 | 55 | 195 | 45 |
| 3D | APB/PMDA | 0.69 | 27600 | 60 | 210 | 48 |
| 4D | m-BP/PMDA | 0.82 | 34500 | 52 | 265 | 47 |
| 5D | (m-BP$_{90}$/ODA$_{10}$)/PMDA | 0.70 | 30700 | 58 | 275 | 55 |

Note:
The subscripts in the composition of Synthesis Example 5D indicate the mole fractions.

TABLE 2-D

| Example | Polymer used | Amount of heat-treated talc (parts by weight) | Film thickness (μm) | Glass transition temperature (° C.) | Linear expansion coefficient (ppm/K) | Ash content (%) |
|---|---|---|---|---|---|---|
| 1D | Synthesis example 2D | 30 | 28 | 208 | 22 | 24 |
| 2D | Synthesis example 2D | 15 | 29 | 202 | 36 | 14 |
| 3D | Synthesis example 2D | 45 | 33 | 216 | 20 | 33 |
| 4D | Synthesis example 3D | 30 | 26 | 227 | 19 | 24 |
| 5D | Synthesis example 3D | 15 | 31 | 219 | 33 | 13 |
| 6D | Synthesis example 4D | 30 | 30 | 296 | 22 | 23 |
| 7D | Synthesis example 5D | 30 | 30 | 306 | 18 | 25 |

| Reference example | Polymer used | Amount of non-heat-treated talc (parts by weight) | Film thickness (μm) | Glass transition temperature (° C.) | Linear expansion coefficient (ppm/K) | Ash content (%) |
|---|---|---|---|---|---|---|
| 1D | Synthesis example 2D | 30 | 31 | 196 | 21 | 25 |
| 2D | Synthesis example 2D | 15 | 30 | 196 | 37 | 15 |
| 3D | Synthesis example 2D | 45 | 29 | 198 | 19 | 34 |
| 4D | Synthesis example 3D | 30 | 30 | 214 | 20 | 25 |
| 5D | Synthesis example 3D | 15 | 31 | 214 | 35 | 14 |
| 6D | Synthesis example 5D | 30 | 32 | 277 | 27 | 25 |

Note 1:
The amount of talc indicates the amount per 100 parts by weight of a polyamic acid.
Note 2:
The ash content was calculated from the amount of residue after firing at 900° C. in TGA with a polyimide composite film being 100%.

Abbreviations for raw materials and solvents common to Examples 1E to 12E and Reference Examples 1E to 7E and their tables are as follows:

a) Diamines
  NBDA; norbornanediamine (compound 1E)
  ONDA; oxanorbornanediamine (compound 2E)
  H-XDA; 1,3-bis(aminomethyl)cyclohexane (compound 3E)
  IPDA; isophoronediamine (compound 4E)
  H-MDA; 4,4'-methylenebis(cyclohexylamine) (compound 5E)

b) Aromatic Tetracarboxylic Acid Dianhydrides
  PMDA; pyromellitic acid dianhydride (compound 6E)
  BPDA; 3,3',4,4'-biphenyltetracarboxylic acid dianhydride (compound 7E)
  ODPA; bis(3,4-dicarboxyphenyl)ether dianhydride (compound 8E)
  6FDA; 2,2-bis(3,4-dicarboxyphenyl)-1,1,1,3,3,3-hexafluoropropane dianhydride (compound 9E)

Compound 1E

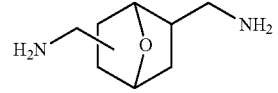

Compound 2E

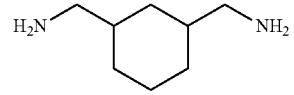

Compound 3E

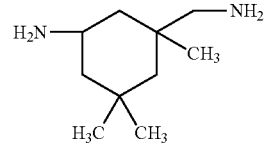

Compound 4E

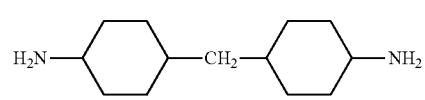

Compound 5E

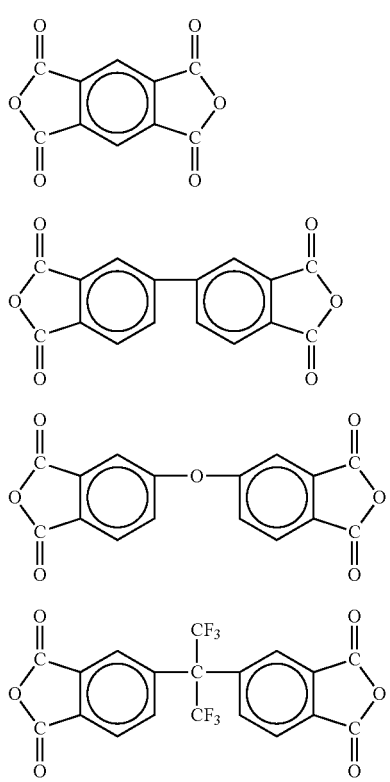

Compound 6E

Compound 7E

Compound 8E

Compound 9E

Synthesis Example 1E

Heat Treatment of Silicate Compound Having Flat Structure

A powder of commercially available talc (product name: FFR, manufactured by Asada Milling Co., Ltd.: containing 6.58% by mass calcium carbonate [2.64% by mass in terms of Ca metal]) in a porcelain crucible was placed in a muffle furnace (product name: Automatic Muffle Furnace TMF5) available from Thomas Kagaku Co., Ltd., was heated in the airstream from 30° C. to 700° C. over one hour, and was held at 700° C. for three hours. The heat-treated talc remained a white powder. After cooling, the heat-treated talc was transferred into a sample bottle and was stored in a desiccator. The weight loss of the talc before heat treatment was approximately 2.9% at a temperature in the range of 580° C. to 680° C.

Synthesis Example 2E

Polymerization of Polyimide Precursor Polymer and Preparation of Polyimide Film 153 g (0.700 mol) of pyromellitic acid dianhydride (PMDA) and 420 g of an organic solvent N,N-dimethylacetamide were charged into a 1-L five-neck separable flask equipped with a thermometer, a stirrer, a nitrogen inlet, and a dropping funnel, and were agitated in an ice-water bath at 0° C. to prepare slurry liquid. 108 g (0.700 mol) of norbornanediamine (NBDA) and 188 g of N,N-dimethylacetamide in the dropping funnel were slowly added dropwise over two hours. After the dropwise addition, agitation at room temperature for 16 hours yielded a polymer solution (polyimide precursor polymer varnish) of a polyimide precursor polymer (polyamic acid). The polyimide precursor polymer had an inherent logarithmic viscosity of 0.58 dL/g (35° C., 0.5 g/dL) and an E-type viscosity of 88300 mPa·s.

The resulting polyimide precursor polymer varnish was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide film having a thickness of 36 μm.

This polyimide film had a glass transition temperature (Tg) of 290° C., a total light transmittance of 90%, and a coefficient of linear expansion of 50 ppm/K at a temperature in the range of 100° C. to 200° C. Table 1-E summarizes these results.

Synthesis Examples 3E and 4E

Polyamic acids (polyimide precursor polymer varnishes) and colorless and transparent polyimide films were prepared in the same manner as Synthesis Example 2E except that 108 g (0.700 mol) of norbornanediamine in Synthesis Example 2E was appropriately replaced by 0.700 mol of diamines shown in Table 1-E. Table 1-E also shows the physical properties of the polyamic acids and the polyimide films.

Synthesis Examples 5E to 7E

Polyamic acids (polyimide precursor polymer varnishes) and colorless and transparent polyimide films were prepared in the same manner as Synthesis Example 2E except that 153 g (0.700 mol) of pyromellitic acid dianhydride (PMDA) was appropriately replaced by 0.700 mol of acid dianhydrides shown in Table 1-E. Table 1-E also shows the physical properties of the polyamic acids and the polyimide films.

Synthesis Examples 8E to 10E

Polyamic acids (polyimide precursor polymer varnishes) and colorless and transparent polyimide films were prepared in the same manner as Synthesis Example 2E except that 50% by mole of 108 g (0.700 mol) of norbornanediamine was appropriately replaced by diamines shown in Table 1-E. Table 1-E also shows the physical properties of the polyamic acids and the polyimide films.

Synthesis Example 11E

A polyamic acid (polyimide precursor polymer varnish) and a colorless and transparent polyimide film were prepared in the same manner as Synthesis Example 2E except that 50% by mole of 153 g (0.700 mol) of pyromellitic acid dianhydride (PMDA) was appropriately replaced by an acid dianhydride shown in Table 1-E. Table 1-E also shows the physical properties of the polyamic acid and the polyimide film.

Example 1E 45 parts by weight of the heat-treated talc prepared in Synthesis Example 1E was added to 100 parts by weight of the polyamic acid in the colorless and transparent polyimide precursor varnish prepared in Synthesis Example 2E and was agitated with a planetary mixer (or a kneading, mixing, and degassing apparatus) (manufactured by Keyence Corp., product name: Hybrid Mixer-500) for five minutes to prepare a dispersion liquid of fired talc (a two-component liquid mixture) (a composite varnish). The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 28 µm. This film had an ash content of 33%, a glass transition temperature of 341° C., a coefficient of linear expansion of 17 ppm/K at a temperature in the range of 100° C. to 200° C., and a total light transmittance of 89%. Table 2-E shows these results.

Reference Example 1E 45 parts by weight of non-heat-treated talc was added to 100 parts by weight of the polyamic acid in the colorless and transparent polyimide precursor varnish prepared in Synthesis Example 2E in the same manner as Example 1E and was agitated with a planetary mixer for five minutes to prepare a dispersion liquid of talc. The resulting liquid mixture was applied to a glass substrate with a doctor blade. The substrate was placed in an oven and was heated in a nitrogen stream from 50° C. to 250° C. over two hours. Subsequently, the substrate was held at 250° C. for two hours to form a self-supporting colorless and transparent polyimide composite film having a thickness of 56 µm. This film had an ash content of 36%, a glass transition temperature of 291° C., a coefficient of linear expansion of 23 ppm/K at a temperature in the range of 100° C. to 200° C., and a total light transmittance of 91%. Table 2-E also shows these results.

Examples 2E and 3E

Colorless and transparent polyimide composite films were prepared in the same manner as Example 1E except that the amount of heat-treated talc added in Example 1E was appropriately altered. Table 2-E also shows the physical properties of the resulting composite films.

Reference Examples 2E and 3E

Colorless and transparent polyimide composite films were prepared in the same manner as Reference Example 1E except that the amount of non-heat-treated talc added in Reference Example 1E was appropriately altered. Table 2-E also shows the physical properties of the resulting composite films.

Examples 4E to 12E

Colorless and transparent polyimide composite films were prepared by changing the polymer used in Example 1E from Synthesis Example 2E to other appropriate polymers and using 30 parts by weight of heat-treated talc. Table 2-E also shows the physical properties of the resulting composite films.

Reference Examples 4E to 7E

Colorless and transparent polyimide composite films were prepared by changing the polymer used in Reference Example 1E from Synthesis Example 2E to other appropriate polymers and using 30 parts by weight of non-heat-treated talc. Table 2-E also shows the physical properties of the resulting composite films.

Reference Example 8E

Heat-treated talc was synthesized in the same manner as Synthesis Example 1E except that the commercially available talc (product name: FFR) in Synthesis Example 1E was replaced by different talc having a flat structure (product name: JM156, manufactured by Asada Milling Co., Ltd.: containing 1.06% by mass calcium carbonate [0.43% by mass in terms of Ca metal]). The weight loss of the talc before heat treatment was approximately 0.47% at a temperature in the range of 580° C. to 680° C.

The procedures described in Example 1E were performed using the heat-treated talc thus synthesized in place of the heat-treated talc used in Example 1E to form a self-supporting colorless and transparent polyimide composite film having a thickness of 34 µm. This film had an ash content of 32%, a glass transition temperature of 293° C., a coefficient of linear expansion of 19 ppm/K at a temperature in the range of 100° C. to 200° C., and a total light transmittance of 88%.

TABLE 1-E

| Synthesis example | Composition (diamine/acid dianhydride) | Physical properties of polyamic acid | | Physical properties of polyimide film | | | |
|---|---|---|---|---|---|---|---|
| | | Logarithmic viscosity (dl/g) | E-type viscosity (mPa · s) | Film thickness (µm) | Glass transition temperature (° C.) | Total light transmittance (%) | Linear expansion coefficient (ppm/K) |
| 2E | NBDA/PMDA | 0.58 | 88300 | 36 | 290 | 90 | 50 |
| 3E | H-XDA/PMDA | 0.68 | 56200 | 40 | 259 | 90 | 48 |
| 4E | H-MDA/PMDA | 1.05 | 103000 | 23 | 289 | 87 | 46 |
| 5E | NBDA/BPDA | 0.43 | 20600 | 32 | 249 | 89 | 48 |
| 6E | NBDA/ODPA | 0.53 | 32200 | 42 | 216 | 88 | 60 |
| 7E | NBDA/6FDA | 0.43 | 20500 | 35 | 234 | 89 | 60 |
| 8E | (NBDA$_{50}$/ONDA$_{50}$)/PMDA | 0.44 | 22500 | 32 | 296 | 89 | 49 |
| 9E | (NBDA$_{50}$/H-XDA$_{50}$)/PMDA | 0.51 | 46500 | 34 | 284 | 89 | 48 |
| 10E | (NBDA$_{70}$/IPDA$_{30}$)/PMDA | 0.53 | 48600 | 28 | 313 | 87 | 48 |
| 11E | NBDA/(PMDA$_{50}$/BPDA$_{50}$) | 0.41 | 19600 | 32 | 267 | 89 | 49 |

Note:
The subscripts in the compositions of Synthesis Examples 8E to 11E indicate the mole fractions.

TABLE 2-E

| Example | Polymer used | Amount of heat-treated talc (parts by weight) | Film thickness (μm) | Glass transition temperature (° C.) | Total light transmittance (%) | Linear expansion coefficient (ppm/K) | Ash content (%) |
|---|---|---|---|---|---|---|---|
| 1E | Synthesis example 2E | 45 | 28 | 341 | 89 | 17 | 33 |
| 2E | Synthesis example 2E | 30 | 28 | 333 | 90 | 22 | 25 |
| 3E | Synthesis example 2E | 15 | 27 | 323 | 89 | 31 | 14 |
| 4E | Synthesis example 3E | 30 | 34 | 299 | 91 | 20 | 25 |
| 5E | Synthesis example 4E | 30 | 32 | 339 | 89 | 18 | 26 |
| 6E | Synthesis example 5E | 30 | 30 | 286 | 90 | 23 | 25 |
| 7E | Synthesis example 6E | 30 | 31 | 257 | 89 | 28 | 24 |
| 8E | Synthesis example 7E | 30 | 29 | 227 | 90 | 27 | 24 |
| 9E | Synthesis example 8E | 30 | 30 | 336 | 91 | 20 | 25 |
| 10E | Synthesis example 9E | 30 | 31 | 321 | 90 | 21 | 24 |
| 11E | Synthesis example 10E | 30 | 29 | 350 | 89 | 21 | 25 |
| 12E | Synthesis example 11E | 30 | 30 | 306 | 88 | 22 | 26 |

| Reference example | Polymer used | Amount of non-heat-treated talc (parts by weight) | Film thickness (μm) | Glass transition temperature (° C.) | Total light transmittance (%) | Linear expansion coefficient (ppm/K) | Ash content (%) |
|---|---|---|---|---|---|---|---|
| 1E | Synthesis example 2E | 45 | 56 | 291 | 91 | 23 | 36 |
| 2E | Synthesis example 2E | 30 | 48 | 291 | 91 | 27 | 28 |
| 3E | Synthesis example 2E | 15 | 48 | 290 | 90 | 34 | 16 |
| 4E | Synthesis example 3E | 30 | 45 | 260 | 89 | 24 | 25 |
| 5E | Synthesis example 6E | 30 | 43 | 217 | 88 | 34 | 26 |
| 6E | Synthesis example 8E | 30 | 44 | 298 | 90 | 25 | 28 |
| 7E | Synthesis example 11E | 30 | 42 | 266 | 90 | 28 | 27 |

Note 5:
The amount of talc indicates the amount per 100 parts by weight of a polyamic acid.

Note 6:
The ash content was calculated from the amount of residue after firing at 900° C. in TGA with a polyimide composite film being 100%.

The invention claimed is:

1. A polyamic acid solution (S2) comprising:
   a polyamic acid (PAA1) having the following general formula (1);

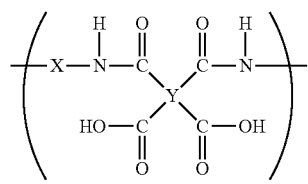
(1)

wherein in the formula (1), X denotes a divalent organic group, and Y denotes a tetravalent organic group,
   a solvent (C) in which the polyamic acid (PAA1) is dissolved; and
   a substance (M) selected from the group consisting of calcium hydroxide, magnesium hydroxide, and strontium hydroxide, wherein the amount of substance (M) is from 1.4 to 14 equivalents per 100 equivalents of a constitutional repeating unit of the polyamic acid (PAA1) having the formula (1).

2. The polyamic acid solution (S2) according to claim 1, wherein the solvent (C) is an aprotic polar solvent (C).

3. A method for producing the polyamic acid solution (S2) according to claim 1, comprising the following steps 1 and 2 of:
   (step 1) producing a polyamic acid solution (S1) produced from the polyamic acid (PAA1) having the general formula (1) wherein X denotes a divalent organic group, and Y denotes a tetravalent organic group and the solvent (C) in which the polyamic acid (PAA1) is dissolved, the polyamic acid (PAA1) being produced from a tetracarboxylic acid anhydride (A) and a diamine compound (B); and

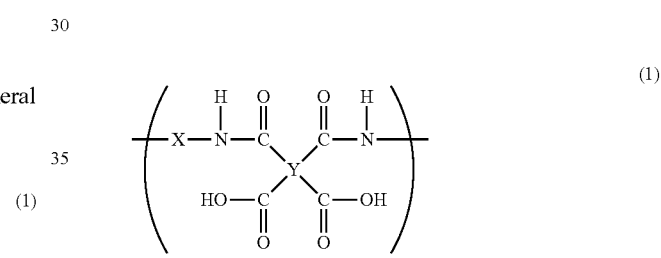
(1)

(step 2) adding 1.4 to 14 equivalents of the substance (M) selected from the group consisting of calcium hydroxide, magnesium hydroxide, and strontium hydroxide per 100 equivalents of a constitutional repeating unit of the polyamic acid (PAA1) having the formula (1) to the polyamic acid solution (S1) produced in the step 1 to produce the polyamic acid solution (S2), wherein the solution viscosity (V1) of the polyamic acid solution (S1) before the addition of the substance (M) (E-type viscosity measured at 25° C.) and the solution viscosity (V2) of the polyamic acid solution (S2) after the addition of the substance (M) (E-type viscosity measured at 25° C.) satisfy the following formula (I)

$$(V2/V1) \times 100 \geq 120\% \qquad (I).$$

4. A polyimide composite (PIC) produced from the polyamic acid solution (S2) according to claim 1.

5. (The polyimide composite (PIC) according to claim 4 produced by a production method comprising the following steps 1 to 3 of:
   (step 1) producing a polyamic acid solution (S1) produced from the polyamic acid (PAA1) having the general formula (1) wherein X denotes a divalent organic group, and Y denotes a tetravalent organic group, and the solvent (C) in which the polyamic acid (PAA1) is dissolved, the polyamic acid (PAA1) being produced from a tetracarboxylic acid anhydride (A) and a diamine compound (B);

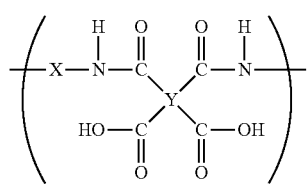 (1)

(step 2) adding 1.4 to 14 equivalents of the substance (M) selected from the group consisting of calcium hydroxide, magnesium hydroxide, and strontium hydroxide per 100 equivalents of a constitutional repeating unit of the polyamic acid (PAA1) having the formula (1) to the polyamic acid solution (S1) produced in the step 1 to produce the polyamic acid solution (S2), wherein the solution viscosity (V1) of the polyamic acid solution (S1) before the addition of the substance (M) (E-type viscosity measured at 25° C.) and the solution viscosity (V2) of the polyamic acid solution (S2) after the addition of the substance (M) (E-type viscosity measured at 25° C.) satisfy the following formula (I); and $$(V2/V1) \times 100 \geq 120\% \quad (I)$$

(step 3) producing the polyimide composite (PIC) by imidization of a polyamic acid (PAA2) contained in the polyamic acid solution (S2) produced in the step 2 and removal of the solvent (C).

6. The polyimide composite (PIC) according to claim 5, wherein the glass transition temperature (Tg1) of a polyimide (PI) produced not through the step 2 but through the step 3 using the polyamic acid solution (S1) produced in the step 1 and the glass transition temperature (Tg2) of the polyimide composite (PIC) satisfy the following formula (II) (K means absolute temperature)

$$Tg2 - Tg1 \geq 5 \, K \quad (II).$$

7. The polyimide composite (PIC) according to claim 4, wherein a polyimide contained in the polyimide composite (PIC) has a constitutional unit having the following general formula (2)

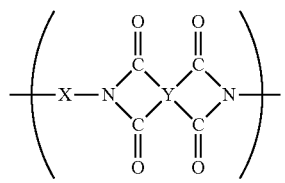 (2)

wherein in the formula (2), X denotes a divalent organic group, and Y denotes a tetravalent organic group.

8. The polyimide composite (PIC) according to claim 7, wherein X in the constitutional unit having the general formula (2) is at least one divalent alicyclic group selected from the group consisting of

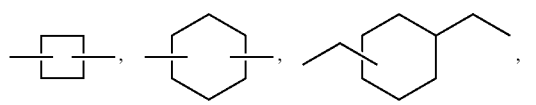

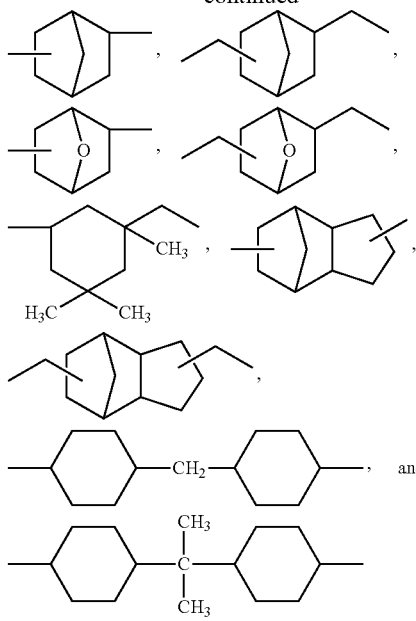

or at least one bivalent aromatic group selected from the group consisting of

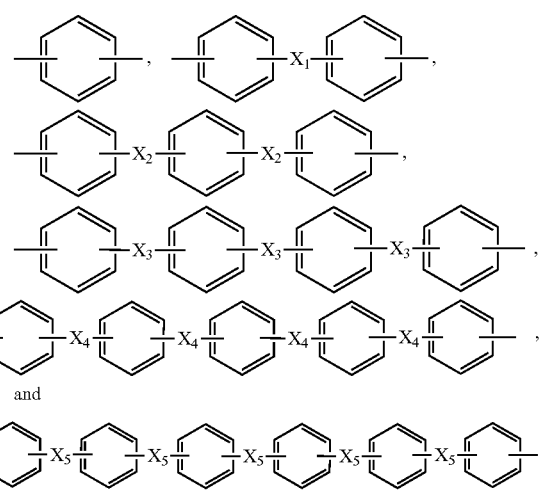

and

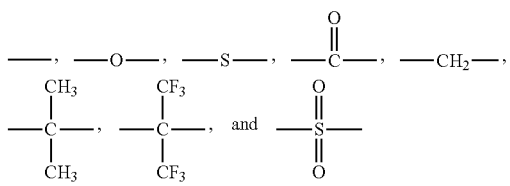

wherein $X_1$ to $X_5$ are selected from

—, —O—, —S—, —$\overset{\overset{\displaystyle O}{\|}}{C}$—, —CH$_2$—, —$\overset{\overset{\displaystyle CH_3}{|}}{\underset{\underset{\displaystyle CH_3}{|}}{C}}$—, —$\overset{\overset{\displaystyle CF_3}{|}}{\underset{\underset{\displaystyle CF_3}{|}}{C}}$—, and —$\overset{\overset{\displaystyle O}{\|}}{\underset{\underset{\displaystyle O}{\|}}{S}}$— and $X_2$ to $X_5$ may be the same or different from one another, and

Y in the constitutional unit having the general formula (2) is at least one tetravalent aromatic group selected from the group consisting of

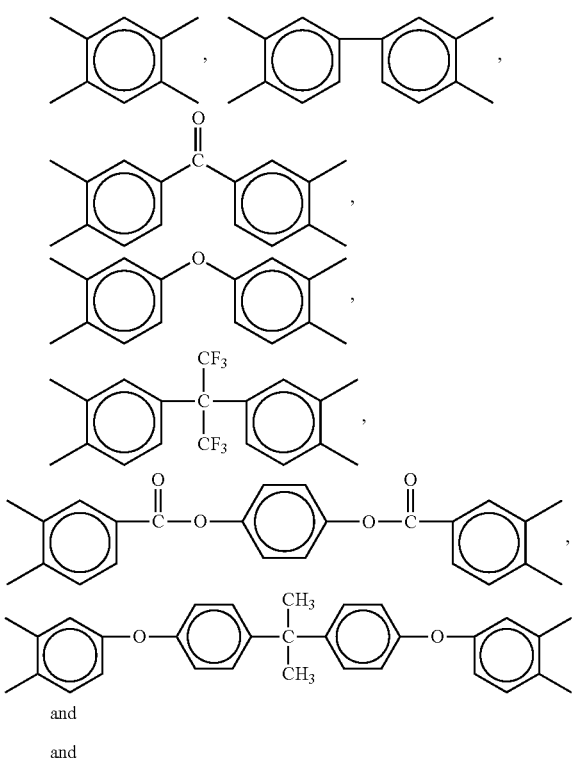

or at least one tetravalent alicyclic group selected from the group consisting of

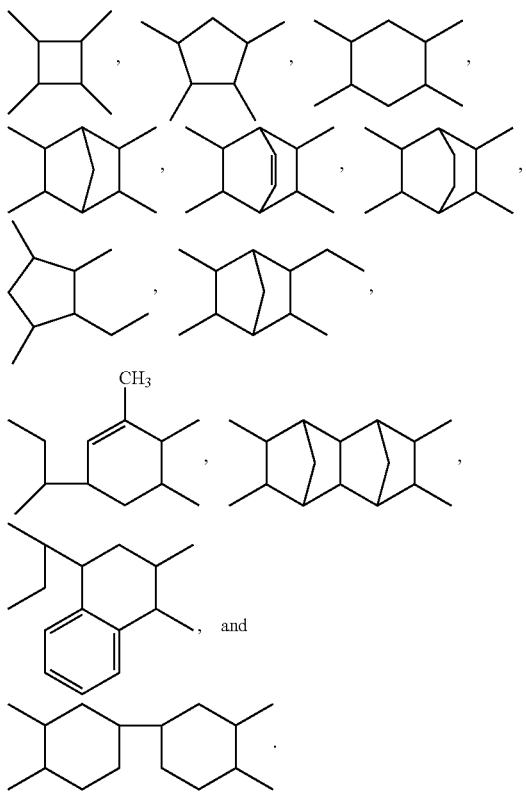

9. The polyimide composite (PIC) according to claim 7, wherein X in the constitutional unit having the general formula (2) is a divalent alicyclic group containing 4 to 15 carbon atoms, and Y is a tetravalent aromatic group containing 6 to 27 carbon atoms.

10. The polyimide composite (PIC) according to claim 7, wherein X in the constitutional unit having the general formula (2) is a divalent aromatic group containing 6 to 51 carbon atoms, and Y is a tetravalent alicyclic group containing 4 to 12 carbon atoms.

11. The polyimide composite (PIC) according to claim 7, wherein X in the constitutional unit having the general formula (2) is a divalent alicyclic group containing 4 to 15 carbon atoms, and Y is a tetravalent alicyclic group containing 4 to 12 carbon atoms.

12. The polyimide composite (PIC) according to claim 7, wherein X in the constitutional unit having the general formula (2) is a divalent aromatic group containing 6 to 51 carbon atoms, and Y is a tetravalent aromatic group containing 6 to 27 carbon atoms.

13. The polyimide composite (PIC) according to claim 7, wherein the polyimide composite (PIC) has a glass transition temperature of 200° C. or more and a coefficient of linear expansion below 50 ppm/K at a temperature in the range of 100° C. to 200° C.

14. The polyimide composite (PIC) according to claim 7, wherein the polyimide composite (PIC) has a glass transition temperature of 200° C. or more, a total light transmittance of 80% or more, and a coefficient of linear expansion below 50 ppm/K at a temperature in the range of 100° C. to 200° C.

15. The polyimide composite (PIC) according to claim 4, wherein the polyimide composite (PIC) has a glass transition temperature of 200° C. or more.

16. A polyimide composite film manufactured from the polyimide composite (PIC) according to claim 4.

17. The polyimide composite film according to claim 16, wherein the polyimide composite film is a colorless and transparent optical film.

18. A polyimide/metal composite laminate comprising at least one layer formed from the polyimide composite (PIC) according to claim 4.

19. A cover material for a photosensitive resin, produced from the polyimide composite (PIC) according to claim 4.

20. A polyamic acid composite (PAAC) produced by removing the solvent (C) contained in the polyamic acid solution (S2) according to claim 1.

21. A coating material, comprising the polyamic acid composite (PAAC) according to claim 20.

22. A coating material, comprising the polyamic acid solution (S2) according to claim 1.

23. A method for manufacturing a polyimide composite film, comprising: applying the polyamic acid solution (S2) according to claim 1 at a thickness in the range of 10 to 1000 μm; and heating the polyamic acid solution (S2) at a temperature in the range of 150° C. to 300° C. for 30 minutes to 4 hours in the air or in an inert atmosphere.

24. A polyamic acid solution (S2) comprising:
a polyamic acid (PAA1) having the following general formula (1);

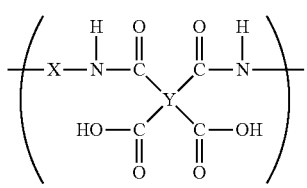
(1)

wherein in the formula (1), X denotes a divalent organic group, and Y denotes a tetravalent organic group, a solvent (C) in which the polyamic acid (PAA1) is dissolved; and heat-treated talc (T) that contains a substance selected from the group consisting of calcium oxide and calcium carbonate wherein the heat-treated talc (T) is heat-treated at a temperature in the range of 650° C. to 800° C.

25. A polyimide composite (PIC) produced from the polyamic acid solution (S2) according to claim 24.

26. The polyimide composite (PIC) according to claim 25, wherein a polyimide contained in the polyimide composite (PIC) has a constitutional unit having the following general formula (2)

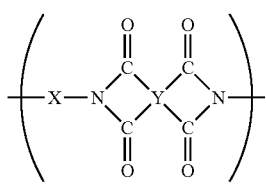
(2)

wherein in the formula (2), X denotes a divalent organic group, and Y denotes a tetravalent organic group.

27. The polyimide composite (PIC) according to claim 26, wherein X in the constitutional unit having the general formula (2) is at least one divalent alicyclic group selected from the group consisting of

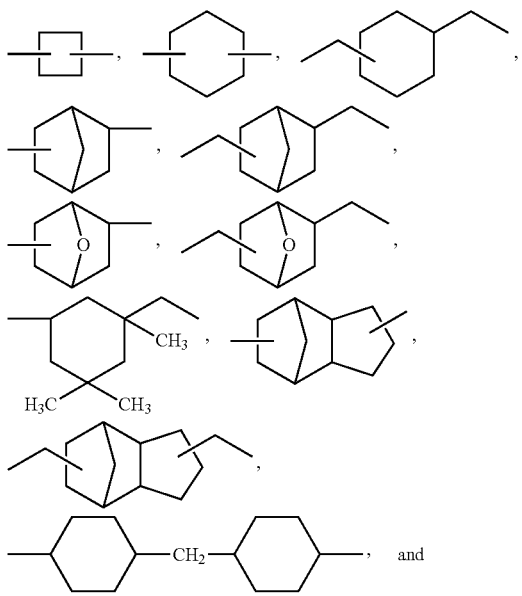

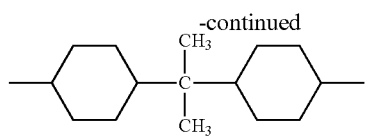

or at least one bivalent aromatic group selected from the group consisting of

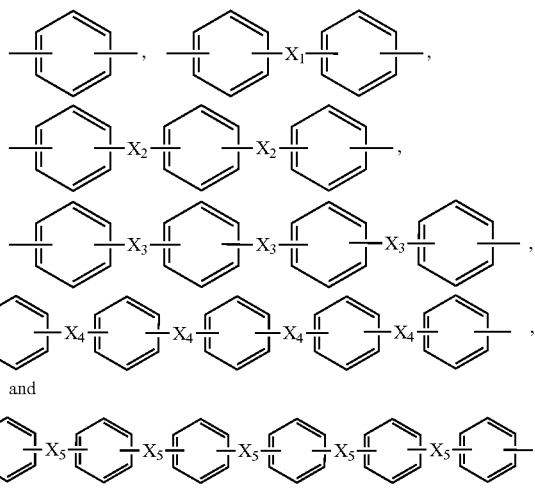

and

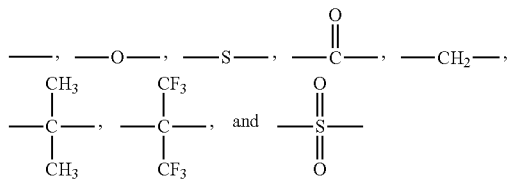

wherein $X_1$ to $X_5$ are selected from $$—, —O—, —S—, —\overset{\overset{O}{\|}}{C}—, —CH_2—,$$
$$—\underset{\underset{CH_3}{|}}{\overset{\overset{CH_3}{|}}{C}}—, —\underset{\underset{CF_3}{|}}{\overset{\overset{CF_3}{|}}{C}}—, \text{ and } —\underset{\underset{O}{\|}}{\overset{\overset{O}{\|}}{S}}—$$

and $X_2$ to $X_5$ may be the same or different from one another, and

Y in the constitutional unit having the general formula (2) is at least one tetravalent aromatic group selected from the group consisting of

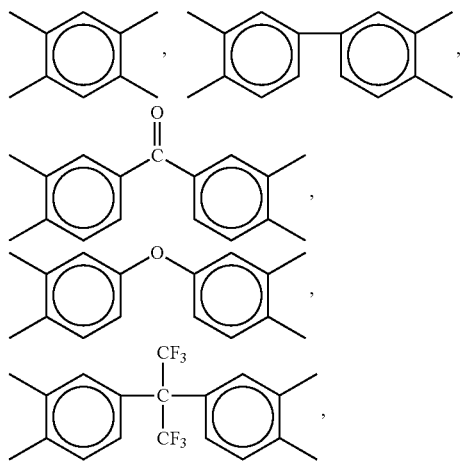

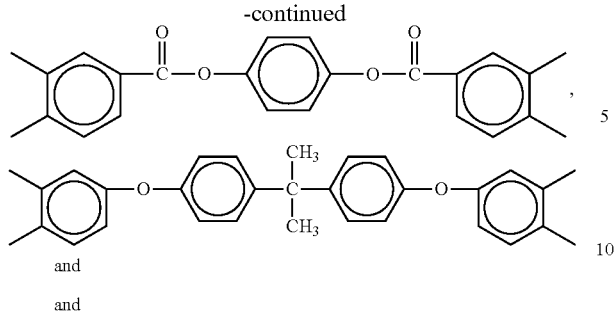
and
and or at least one tetravalent alicyclic group selected from the group consisting of

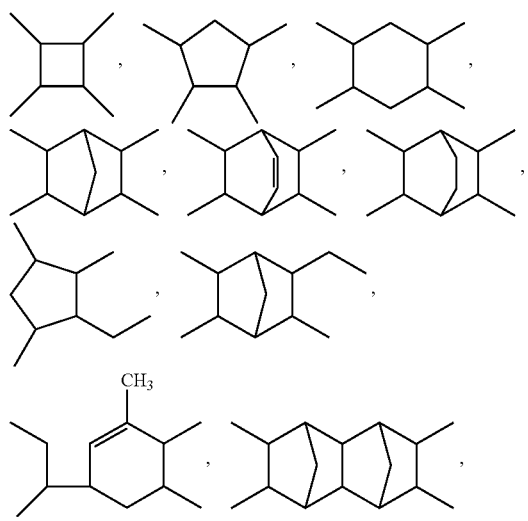

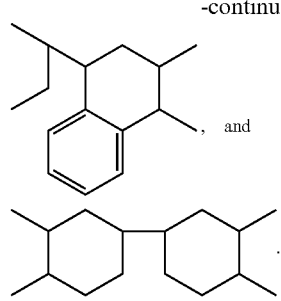, and

28. The polyimide composite (PIC) according to claim 26, comprising 5 to 50 parts by weight of the heat-treated talc (T) per 100 parts by weight of the polyimide.

29. The polyimide composite (PIC) according to claim 28, wherein the polyimide composite (PIC) has a glass transition temperature of 200° C. or more and a coefficient of linear expansion below 50 ppm/K at a temperature in the range of 100° C. to 200° C.

30. The polyimide composite (PIC) according to claim 28, wherein the polyimide composite (PIC) has a glass transition temperature of 200° C. or more, a total light transmittance of 80% or more, and a coefficient of linear expansion below 50 ppm/K at a temperature in the range of 100° C. to 200° C.

31. The polyimide composite (PIC) according to claim 25, wherein the polyimide composite (PIC) has a glass transition temperature of 200° C. or more.

32. A polyimide composite film manufactured from the polyamic acid solution (S2) according to claim 24.

33. A coating material, comprising the polyamic acid solution (S2) according to claim 24.

* * * * *